(12) United States Patent
Tokuda

(10) Patent No.: US 7,994,067 B2
(45) Date of Patent: Aug. 9, 2011

(54) SEMICONDUCTOR MANUFACTURING EQUIPMENT WITH AN OPEN-TOPPED CASSETTE APPARATUS

(75) Inventor: Norifumi Tokuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 434 days.

(21) Appl. No.: 10/578,883

(22) PCT Filed: Sep. 27, 2004

(86) PCT No.: PCT/JP2004/014092
§ 371 (c)(1),
(2), (4) Date: May 11, 2006

(87) PCT Pub. No.: WO2006/035484
PCT Pub. Date: Apr. 6, 2006

(65) Prior Publication Data
US 2007/0041812 A1    Feb. 22, 2007

(51) Int. Cl.
*H01L 21/461* (2006.01)
(52) U.S. Cl. ............................. 438/745; 257/E21.219
(58) Field of Classification Search ............ 438/800, 438/745, 747, 748; 414/935–941; 257/E21.219
See application file for complete search history.

(56) References Cited

U.S. PATENT DOCUMENTS

| | | | | |
|---|---|---|---|---|
| 4,770,680 A * | 9/1988 | Machida et al. | ............ | 55/385.1 |
| 4,901,011 A * | 2/1990 | Koike et al. | ............ | 324/757 |
| 6,313,023 B1 * | 11/2001 | Maruyama | ............ | 438/597 |
| 6,474,987 B1 | 11/2002 | Nakai et al. | | |
| 6,964,928 B2 * | 11/2005 | Ying et al. | ............ | 438/706 |
| 7,014,415 B2 * | 3/2006 | Yoshizawa | ............ | 414/797.5 |
| 2002/0182892 A1 | 12/2002 | Arai et al. | | |
| 2003/0019585 A1 | 1/2003 | Tometsuka | | |
| 2003/0029570 A1 | 2/2003 | Kawamura et al. | | |
| 2005/0282371 A1 * | 12/2005 | Patton et al. | ............ | 438/597 |

FOREIGN PATENT DOCUMENTS

| | | |
|---|---|---|
| JP | 1-262639 | 10/1989 |
| JP | 5-246508 | 9/1993 |
| JP | 5-343378 | 12/1993 |
| JP | 7-201948 | 8/1995 |
| JP | 11-193499 | 7/1999 |
| JP | 2001-176808 | 6/2001 |
| JP | 2001-326189 | 11/2001 |
| JP | 2002-237516 | 8/2002 |

* cited by examiner

*Primary Examiner* — Hsien-ming Lee
*Assistant Examiner* — Kevin Parendo
(74) *Attorney, Agent, or Firm* — Oblon, Spivak, McClelland, Maier & Neustadt, L.L.P.

(57) ABSTRACT

A semiconductor manufacturing apparatus and a semiconductor manufacturing method, and has as one object to process a wafer easily and stably irrespective of thickness. To achieve the above object, a semiconductor manufacturing apparatus includes: an open-topped cassette that encases a semiconductor substrate; a plurality of processors for performing a predetermined processing of the semiconductor substrate; and a transporting mechanism that transports the cassette encasing the semiconductor substrate between the plurality of processors.

4 Claims, 23 Drawing Sheets

F I G . 1
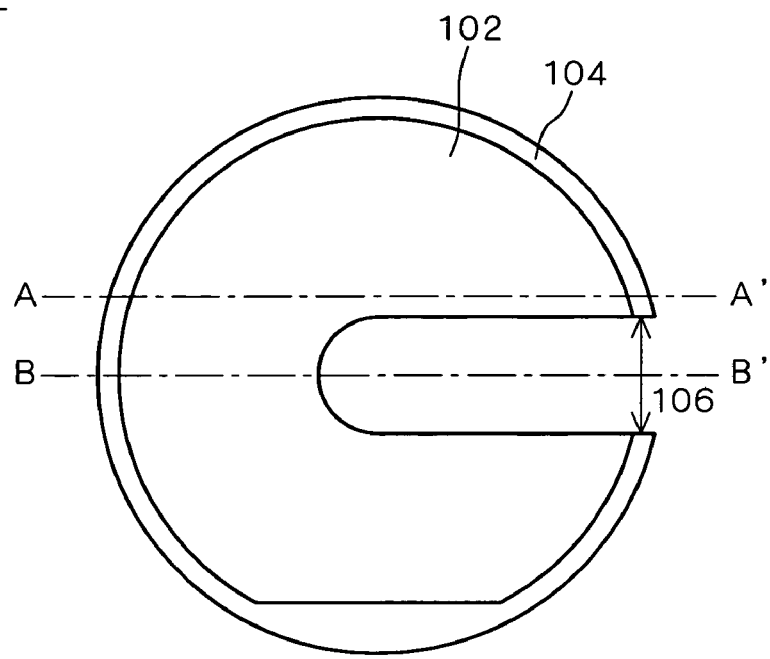
F I G . 2
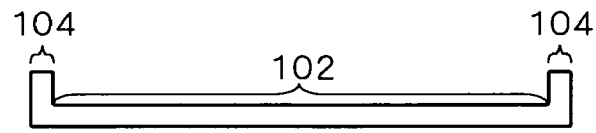
F I G . 3
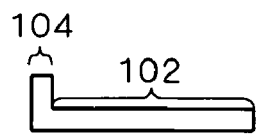

F I G. 1 0
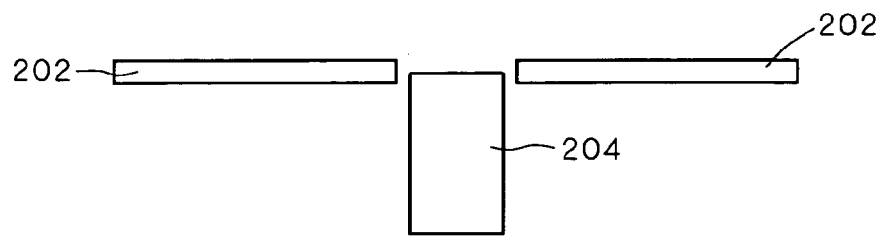
F I G. 1 1
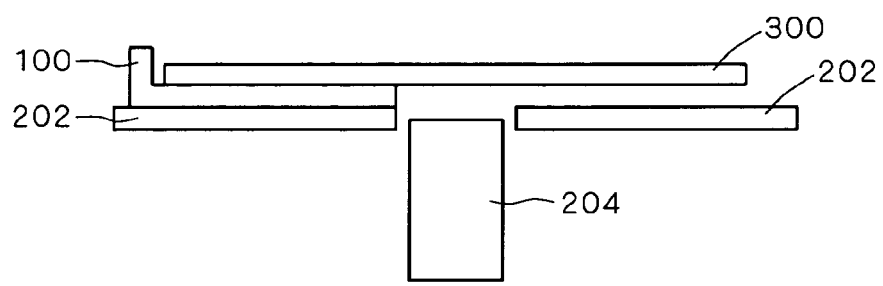
F I G. 1 2
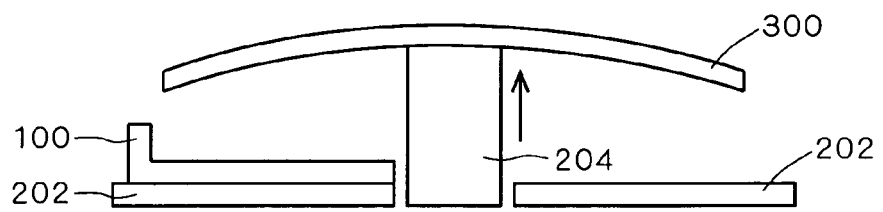
F I G. 1 3
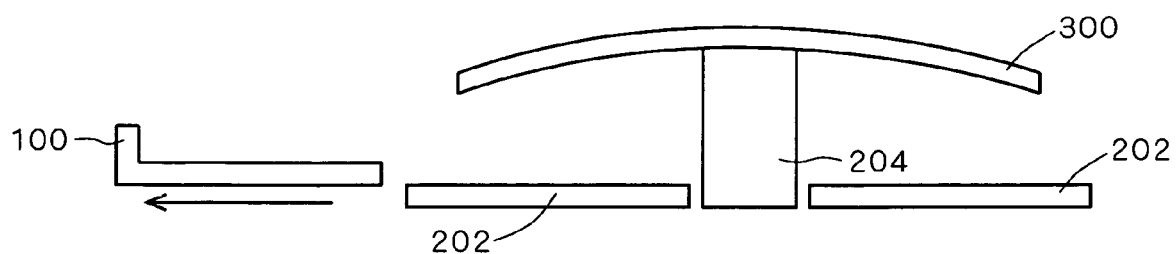

F I G . 2 6
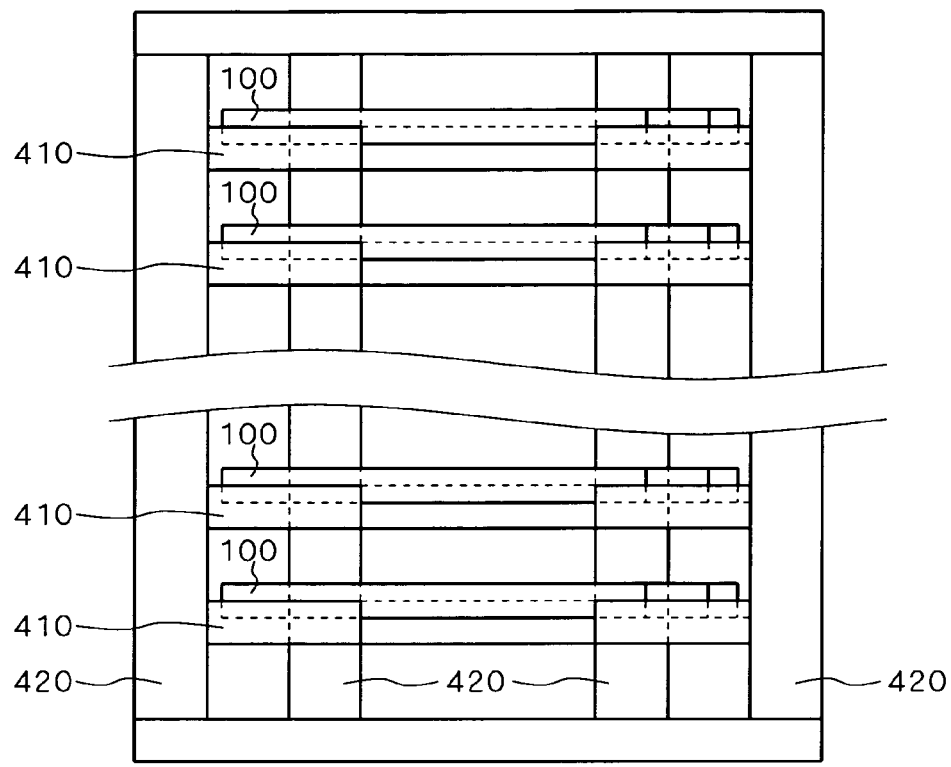
F I G . 2 7
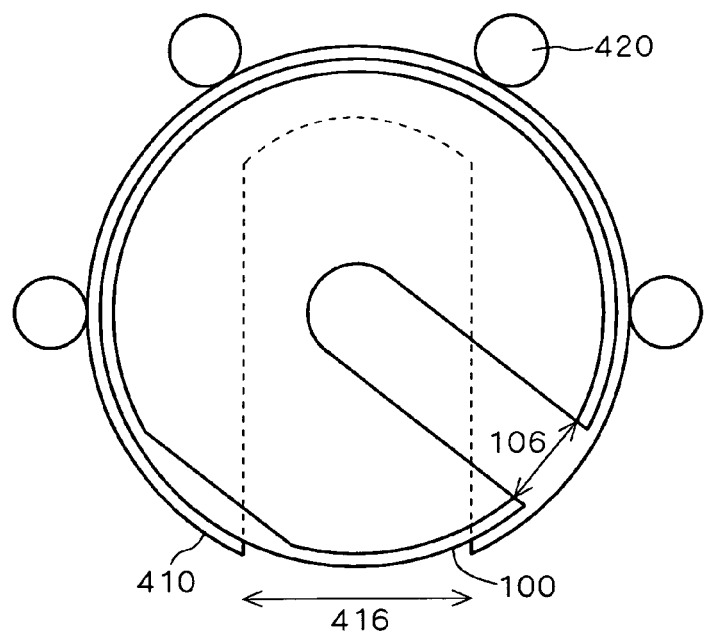

F I G . 2 8
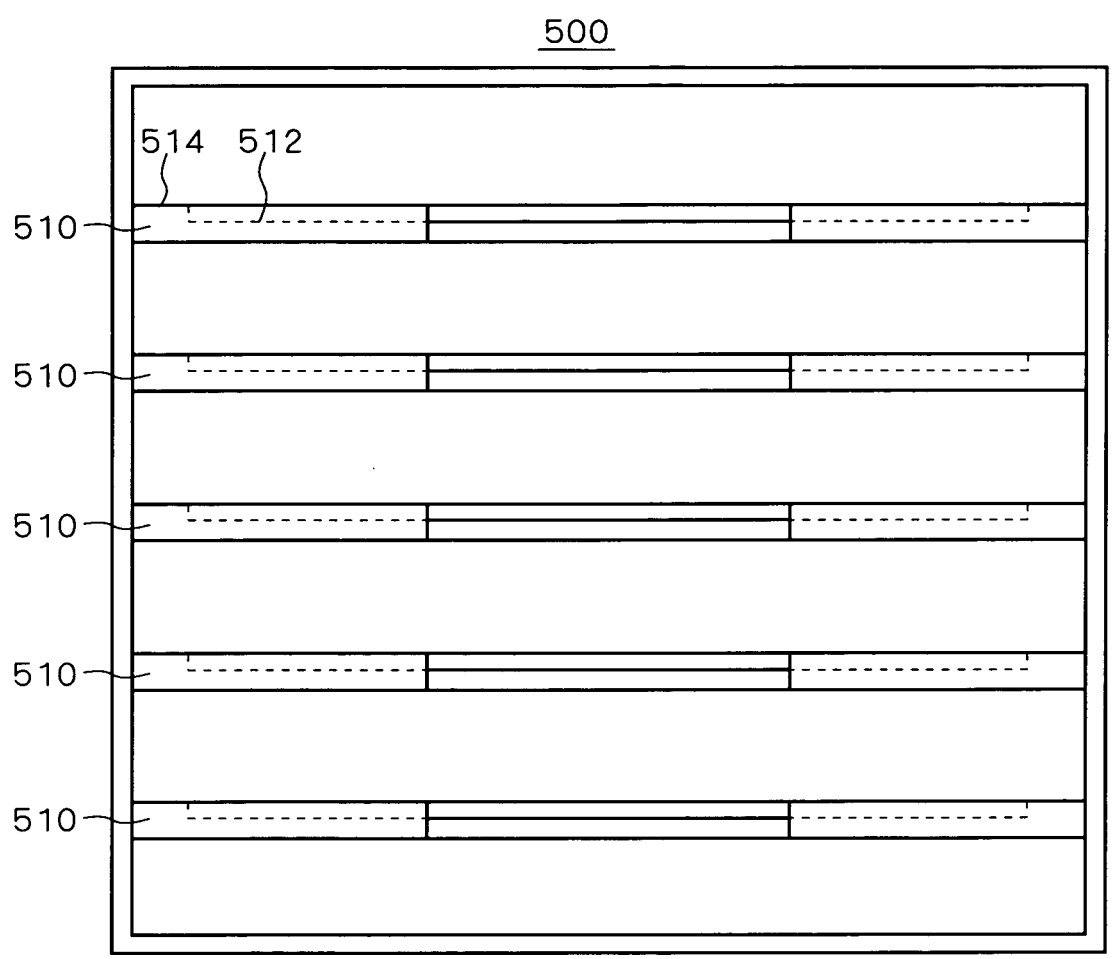

F I G . 2 9
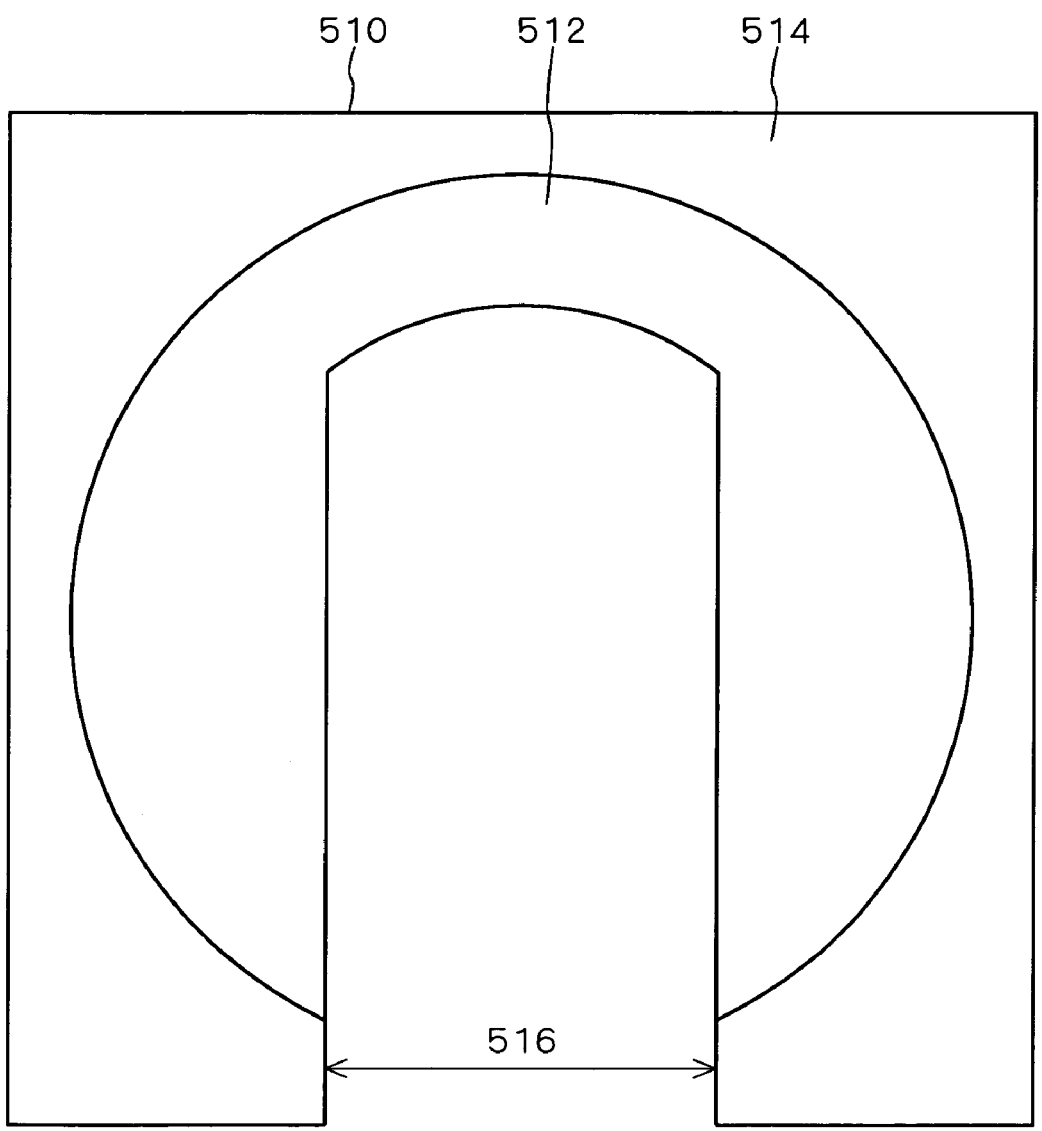

F I G . 3 2
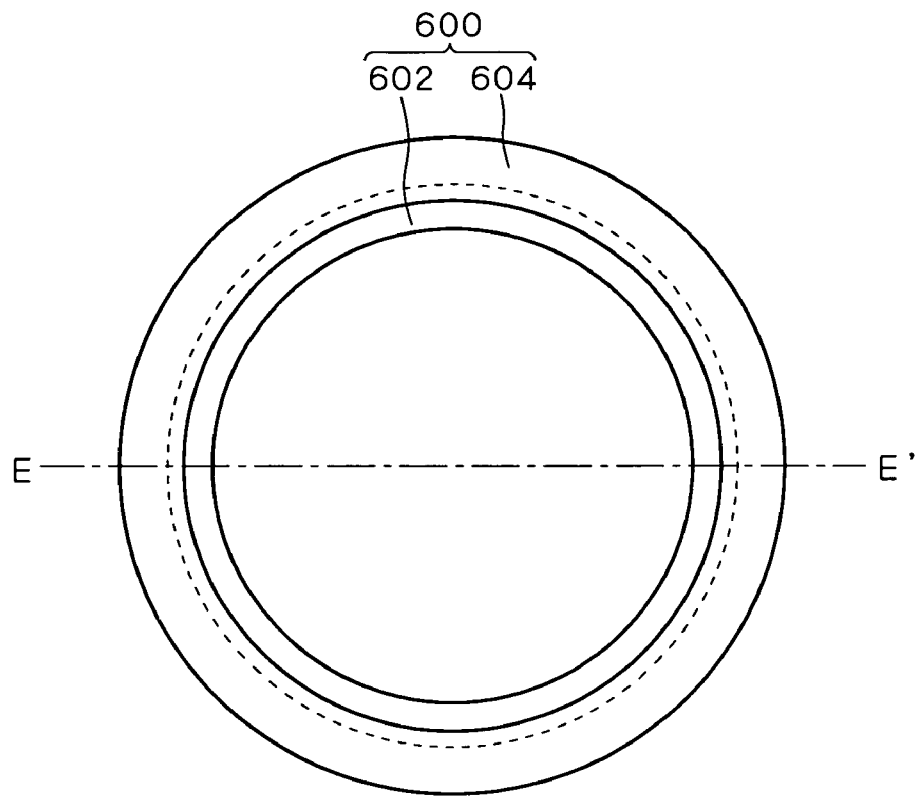
F I G . 3 3

F I G . 3 4
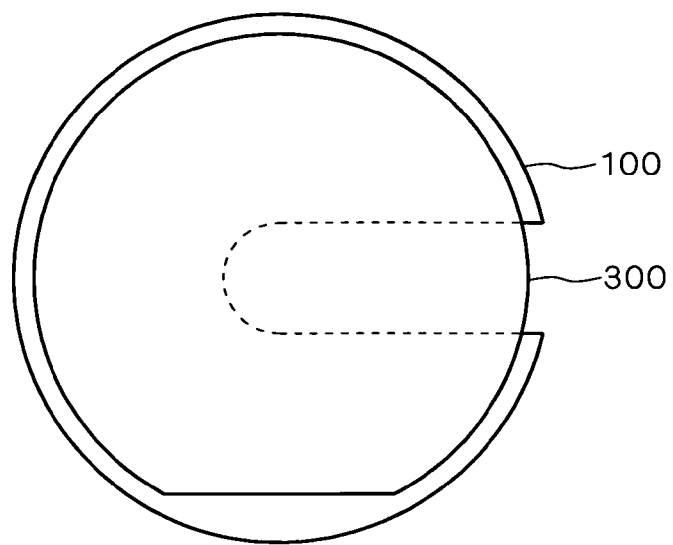
F I G . 3 5
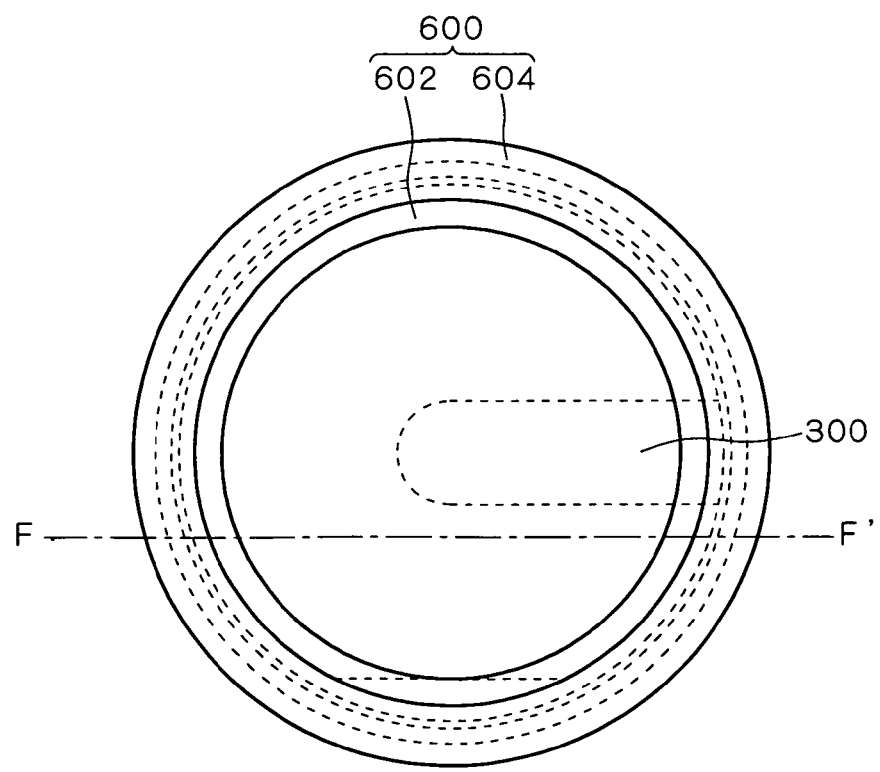

SEMICONDUCTOR MANUFACTURING EQUIPMENT WITH AN OPEN-TOPPED CASSETTE APPARATUS

TECHNICAL FIELD

The present invention relates to a semiconductor manufacturing apparatus and a semiconductor manufacturing method, and more particularly to a processing of a semiconductor substrate.

BACKGROUND ART

In a conventional vertical semiconductor device in which current is allowed to flow across a first main surface and a second main surface of a semiconductor substrate (semiconductor wafer), the semiconductor substrate has become increasingly more thinned film with the purpose of characteristic improvement (for example, on voltage reduction). On the other hand, in the field of high breakdown voltage semiconductor devices that control high voltages exceeding 1000V, it is necessary to become more thickened film according to breakdown voltage. That is, a semiconductor manufacturing apparatus will be increasingly required to process a plurality of semiconductor substrates having different thicknesses. In a wafer for ULSI, such as DRAM, the tendency to increase aperture is proceeding, and the tendency of film thinning to reduce costs is proceeding.

In a semiconductor substrate whose aperture is relatively as large as not less than 6 inches and whose thickness is relatively as thin as not more than 100 μm, its own low strength and bowing or fluxure most probably damage the semiconductor substrate in a semiconductor manufacturing apparatus or during transportation between semiconductor manufacturing apparatuses.

A conventional wafer carrier encases with a plurality of pieces (up to 25) of wafers raised vertically. Since this wafer carrier holds only the peripheral portions of wafers in order to minimize contact with the wafers surfaces, the holding area of the wafers is small. Between semiconductor manufacturing apparatuses or between buildings, this wafer carrier is usually transported as it is, but in some cases, transported with it encased in another case.

A resist coating process and a diffusion process will be described below as an example of processing treatment in a conventional semiconductor manufacturing apparatus.

In a resist coating processing apparatus, a wafer carrier with a wafer encased therein is set on a loader by a robot or manually. When a processing recipe is started, the wafer is taken out from the wafer carrier and transported solely to a position to perform pre-coating-bake and then subjected to pre-coating-bake. The wafer after being subjected to pre-coating-bake is transported solely to a position to perform coating and then subjected to coating. The wafer after being subjected to coating is transported solely to a position to perform post-coating-bake and then subjected to post-coating-bake. The wafer after being subjected to post-coating-bake is transported solely and then encased. The above operation is repeated 25 times to complete the processing of 25 wafers, so that the treated 25 wafers are encased in a wafer carrier set on an unloader. Thereafter, the wafer carrier is taken out from the unloader and transported to a processing treatment apparatus of the next step by a robot or manually.

In a diffusion processing apparatus having a diffusion furnace, a wafer carrier with a wafer encased therein is set on a loader by a robot or manually. When a processing recipe is started, the wafer is taken out from the wafer carrier and transported solely to a wafer encasing boat for holding and encasing wafers, and then arranged on the wafer encasing boat. The wafer encasing boat has a groove for holding a wafer. If the width of the groove is too large, there may arise, for example, the problem that a wafer inclines and contacts with the adjacent wafer especially when the wafer is processed in a vertical position within a horizontal diffusion furnace. To prevent such a problem, a groove having a width corresponding to the thickness of the treated wafer is formed in the wafer encasing boat. The wafer encasing boat with a desired wafer encased therein is transported into the furnace. Within the furnace, diffusion is performed with a desired technique such as oxidation and annealing. Upon the completion of diffusion, the wafer encasing boat is transported to the exterior of the furnace. After cooling the wafer encasing boat and the wafer for a predetermined period of time, the wafer is taken out from the wafer encasing boat and transported solely to the wafer carrier and then encased. Thereafter, the wafer carrier is taken out from the unloader and transported to a processing treatment apparatus of the next step by a robot or manually.

Since the foregoing treatments have been performed in the conventional semiconductor manufacturing apparatus, thin wafers and the like that are low in strength have the problem that they might be damaged or deformed during transportation.

Further, when using a plurality of wafers having different thicknesses, there has been the problem that a different processing may become a necessity in a jig or the like depending on the thickness of a wafer, thus complicating the treatment.

Patent document 1 discloses an example of a wafer transporting and storing method and an example of a wafer carrier, which transport and store with one wafer encased in a flat casing. Patent document 2 discloses an example of a wafer protecting case in which each wafer is encased so as to cover the entire periphery of the wafer.

Patent document 1: Japanese Patent Application Laid-Open Publication No. 5-246508
Patent document 2: Japanese Patent Application Laid-Open Publication No. 2002-237516

However, because the wafer carrier disclosed in Patent document 1 is shaped like a case, there has been the problem that the encasement and takeout of a wafer or the like requires the operations of opening and closing a cover of the wafer carrier, thus complicating the operation.

Also in the wafer protection case disclosed in Patent document 2, there has been the problem that the encasement and takeout of a wafer or the like requires the operations of opening and closing or the like, thus complicating the operation.

DISCLOSURE OF THE INVENTION

The present invention aims at solving the above-mentioned problems and has for its object to obtain a semiconductor manufacturing apparatus and a semiconductor manufacturing method that are capable of easily and stably processing a wafer irrespective of thickness.

An aspect of a semiconductor manufacturing apparatus according to the present invention includes: an open-topped cassette (100) that encases a semiconductor substrate (300); a plurality of processing means for performing a predetermined processing of a semiconductor substrate (300); and transporting means that transports the cassette (100) encasing the semiconductor substrate (300) between the plurality of processing means.

An aspect of a semiconductor manufacturing method according to the present invention includes the steps of: (a)

encasing a semiconductor substrate (300) in an open-topped cassette (100); (b) processing the semiconductor substrate (300) with it encasing in the cassette (100) in a plurality of processing means for performing a predetermined processing; and (c) transporting the cassette (100) encasing the semiconductor substrate (300) between the plurality of processing means.

With the semiconductor manufacturing apparatus and the semiconductor manufacturing method according to the present invention, a wafer can be processed easily and stably irrespective of thickness.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a top view of a wafer cassette according to a first preferred embodiment of the present invention;

FIG. 2 is a sectional view of the wafer cassette of the first preferred embodiment of the invention;

FIG. 3 is a sectional view of the wafer cassette of the first preferred embodiment of the invention;

FIG. 10 is other sectional view of the wafer cassette of the first preferred embodiment of the invention;

FIG. 11 is other sectional view of the wafer cassette of the first preferred embodiment of the invention;

FIG. 12 is other sectional view of the wafer cassette of the first preferred embodiment of the invention;

FIG. 13 is other sectional view of the wafer cassette of the first preferred embodiment of the invention;

FIG. 26 is other front view of the wafer cassette encasing boat according to the first preferred embodiment of the invention;

FIG. 27 is other top view of the wafer cassette holding platform according to the first preferred embodiment of the invention;

FIG. 28 is a front view of a wafer cassette case according to the first preferred embodiment of the invention;

FIG. 29 is other top view of the wafer cassette holding platform according to the first preferred embodiment of the invention;

FIG. 32 is a top view of a wafer fall preventing jig according to the first preferred embodiment of the invention;

FIG. 33 is a sectional view of the wafer fall preventing jig according to the first preferred embodiment of the invention;

FIG. 34 is other top view of the wafer cassette according to the first preferred embodiment of the invention;

FIG. 35 is other top view of the wafer fall preventing jig according to the first preferred embodiment of the invention;

BEST MODE FOR CARRYING OUT THE INVENTION

1. First Preferred Embodiment

FIG. 1 is a top view showing a wafer cassette 100 for use in a semiconductor manufacturing apparatus and a semiconductor manufacturing method according to a first preferred embodiment of the present invention. FIG. 2 is a sectional view taken along the line A-A' in FIG. 1. FIG. 3 is a sectional view taking along the line B-B' in FIG. 1.

As shown in FIG. 1, the wafer cassette 100 includes a wafer holding part 102 (a first holding part) for holding a wafer, which is brought into contact with the bottom surface (the underside) of a wafer (a semiconductor substrate) composed of a semiconductor, and a wafer holding part 104 (a second holding part) for holding a wafer, which is brought into contact with a side surface of a wafer. A slotted opening part 106 is disposed from part of the periphery of the wafer holding part 104 to a center section of the wafer holding part 102. As shown in FIGS. 2 and 3, the wafer holding part 102 has a periphery of approximately the same shape as a wafer, and the wafer holding part 104 is formed at a higher position than the wafer holding part 102. That is, there is a difference in level between the wafer holding part 102 and the wafer holding part 104. This can prevent the wafer placed on the wafer holding part 102 from slipping down from the wafer holding part 102. Moreover, being open-top, the operations such as encasement and takeout of a wafer can be performed easier than the wafer carrier made up of a casing or the like.

Figure 4:
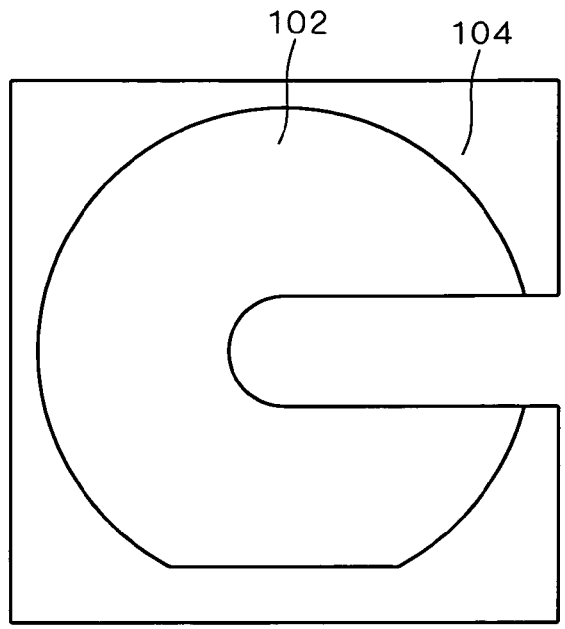
FIG. 4 is other top view of the wafer cassette of the first preferred embodiment of the invention.
Figure 5:
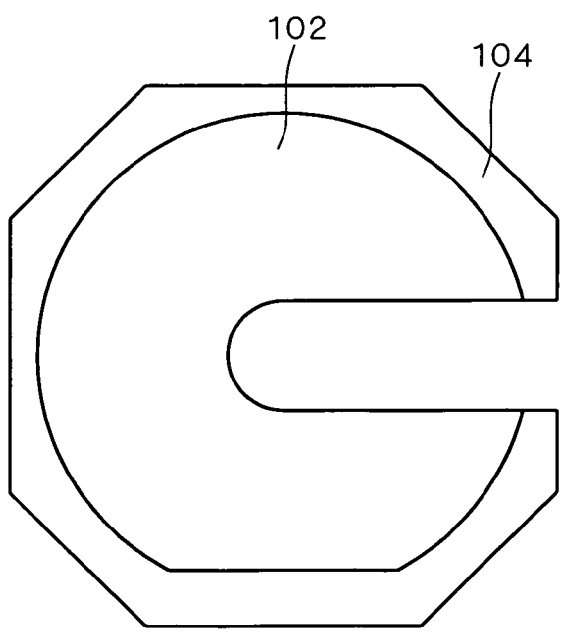
FIG. 5 is other top view of the wafer cassette of the first preferred embodiment of the invention.

As long as the wafer holding part 104 is formed at a higher position than the wafer holding part 102, its peripheral shape may be determined arbitrarily, for example, a square shape as shown in FIG. 4, or an octagonal shape as shown in FIG. 5. Further, the thickness of the wafer holding part 104 and the dimension of a difference in level may be determined arbitrarily depending on the difference in strength or the like due to the material used in the wafer cassette 100. In the following, a description will be made of the case where the thickness of the wafer holding part 102 is approximately 1 mm, and the thickness of a wafer is approximately 100 μm.

In general, a manufacturing process of a semiconductor device is mainly made up of repetition of three steps of: photoengraving processing step, chemical processing step, and heat treatment step. The photoengraving step further includes resist coating processing, exposure processing, and development processing, or the like. The chemical processing step further includes dry etching processing and wet etching processing or the like. The heat treatment step further includes diffusion processing and formed film processing, or the like. In the following, a description will be made of the operation in performing, as an example, resist coating processing and diffusion processing.

First, the operation in a resist coating processing apparatus will be described. The resist coating processing apparatus is a processing treatment apparatus equipped with a plurality of processing means including a loader, a processing treatment stage, and an unloader; and transporting means that transports the wafer cassette 100 encasing a wafer therein between the plurality of processing means.

Figure 6:
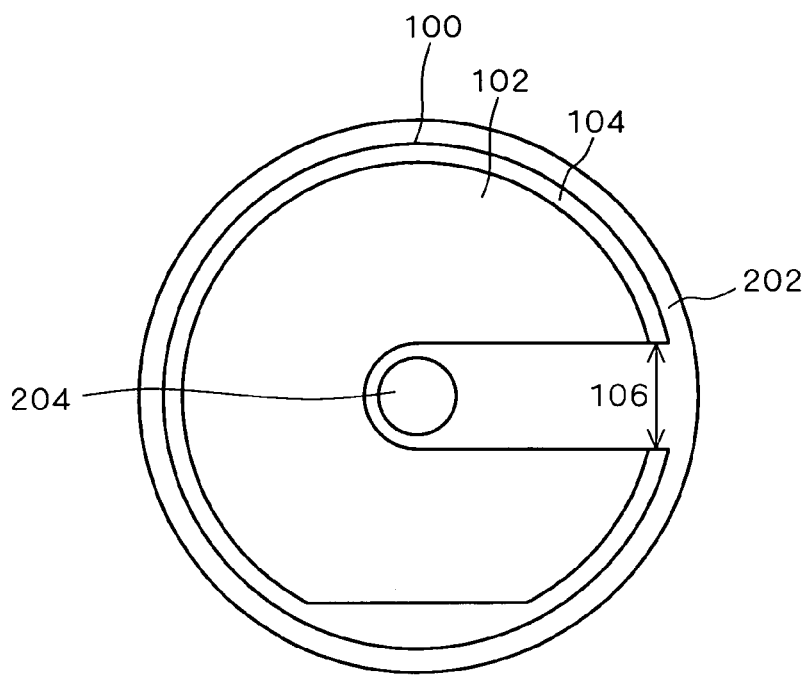
FIG. 6 is other top view of the wafer cassette of the first preferred embodiment of the invention.

FIG. 6 is a top view showing the case where the wafer cassette 100 encasing no wafer is set on a processing treatment stage 202 for pre-coating-bake processing which is included in the resist coating processing apparatus.

In FIG. 6, a wafer lift pin 204 is disposed on the processing treatment stage 202. Disposing a slotted opening part 106 can prevent the wafer lift pint 204 and the wafer cassette 100 from contacting with each other when the wafer lift pin 204 moves up and down to lift a wafer, and the like.

Figure 7:
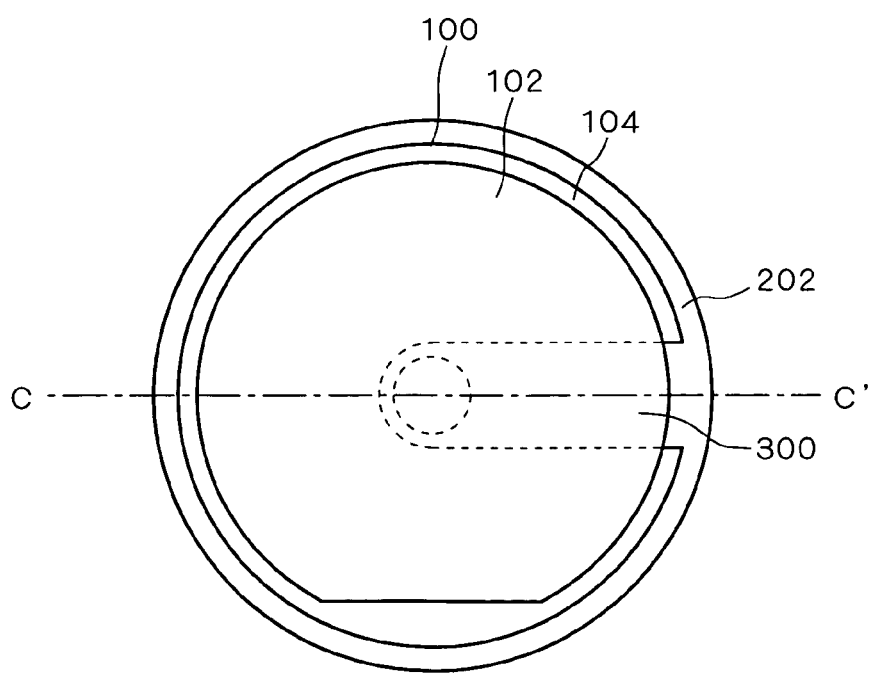
FIG. 7 is other top view of the wafer cassette of the first preferred embodiment of the invention.

FIG. 7 is a top view showing the state in which a wafer 300 is encased over the wafer cassette 100 shown in FIG. 6.

Figure 8:
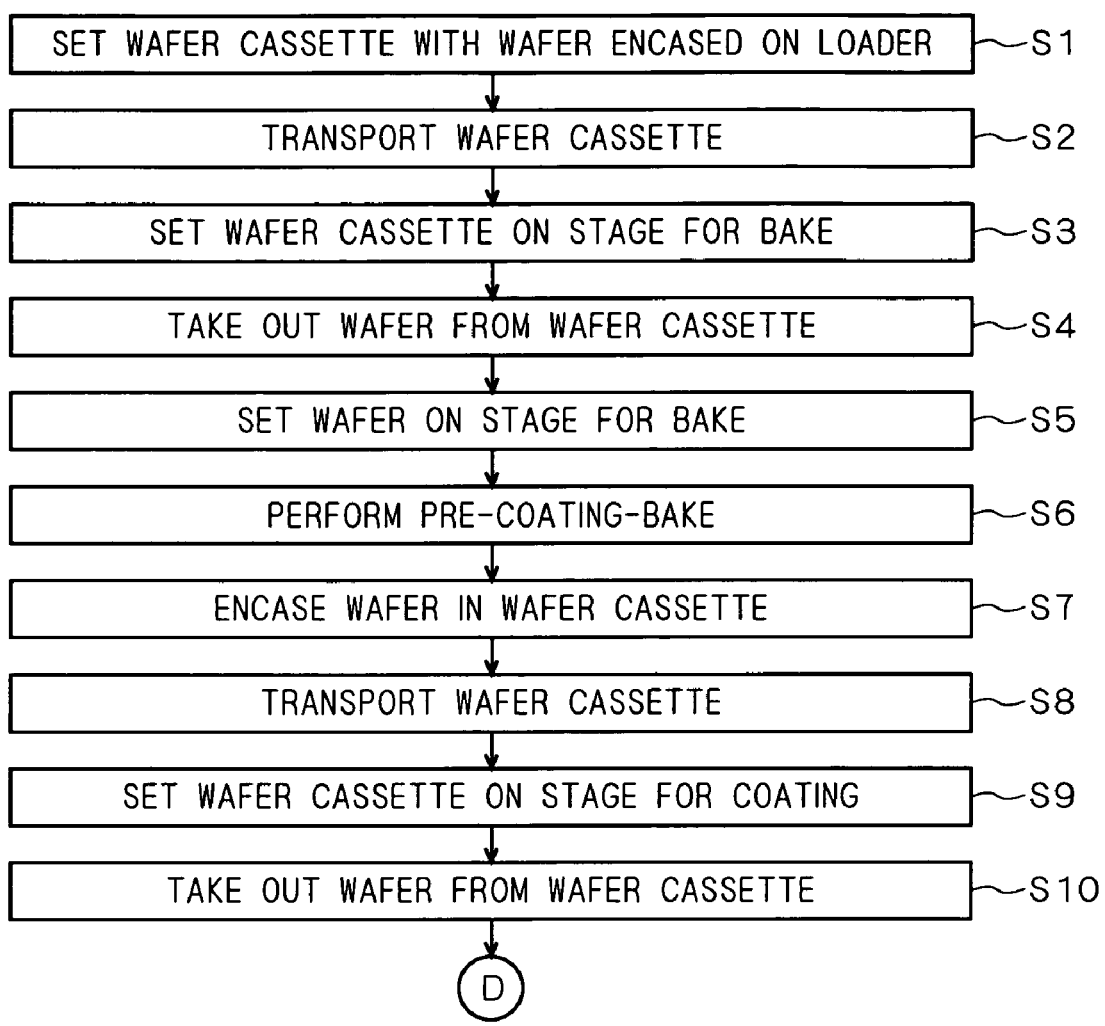
FIG. 8 is a flow chart of coating processing of a wafer according to the first preferred embodiment of the invention.
Figure 9:
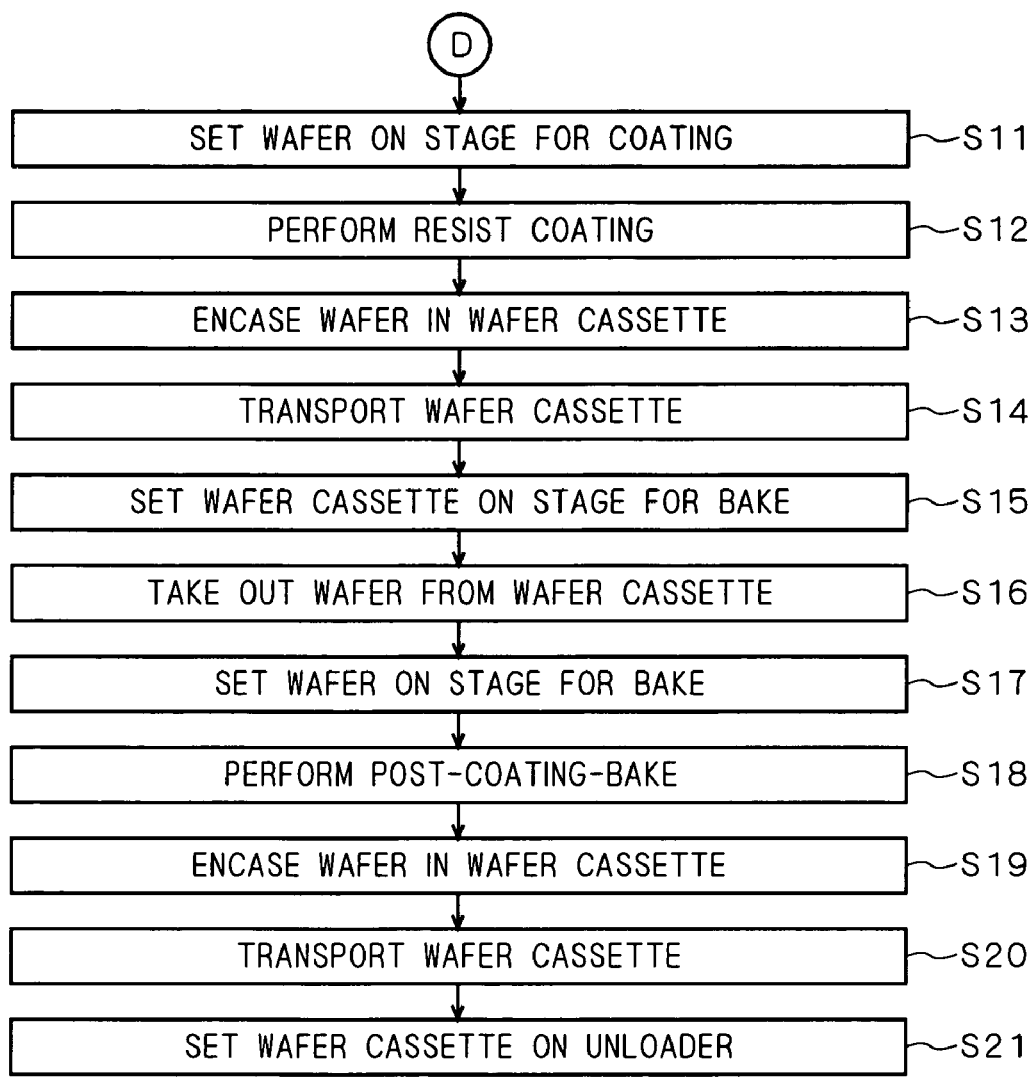
FIG. 9 is other flow chart of the coating processing of a wafer according to the first preferred embodiment of the invention.

The operation when the present invention is applied to a general resist coating processing apparatus will next be described by using the flow charts of FIGS. 8 and 9.

First, the wafer cassette 100 with the wafer 300 encased therein is set on a loader of a resist coating apparatus (step S1).

The wafer cassette 100 with the wafer 300 encased therein is then transported (step S2), and set on the processing treatment stage 202 for pre-coating-bake (step S3).

Subsequently, the wafer 300 is taken out from the wafer cassette 100 set on the processing treatment stage 202 (step S4), and set on the processing treatment stage 202 (step S5). The procedure of taking out the wafer 300 from the wafer cassette 100 set on the processing treatment stage 202, and the procedure of setting the wafer 300 on the processing treatment stage 202 will be described later by using FIGS. 10 to 14.

The wafer 300 is then subjected to pre-coating-bake (step S6).

The wafer 300 is then encased in the wafer cassette 100 (step S7). Subsequently, this wafer cassette 100 is transported (step S8), and then set on a processing treatment stage for resist coating (referred to as 202a for convenience in describing), which has the same shape as the processing treatment stage 202 (step S9).

Subsequently, the wafer 300 is taken out from the wafer cassette 100 set on the processing treatment stage 202a (step S10), and then set on the processing treatment stage 202a (step S11).

Next, the surface of the wafer 300 is subjected to resist coating (step S12).

The wafer 300 is then encased in the wafer cassette 100 (step S13). Subsequently, this wafer cassette 100 is transported (step S14), and then set on a processing treatment stage for post-coating-bake (referred to as 202b for convenience in describing), which has the same shape as the processing treatment stage 202 (step S15).

Subsequently, the wafer 300 is taken out from the wafer cassette 100 set on the processing treatment stage 202b (step S16), and then set on the processing treatment stage 202b (step S17).

Next, the wafer 300 is subjected to post-coating-bake (step S18).

The wafer 300 is then encased in the wafer cassette 100 (step S19). This wafer cassette 100 is transported (step S20), and set on an unloader of the resist coating processing apparatus (step S21).

Through the foregoing steps S1 to S21, the resist coating processing is completed. The wafer cassette 100 is then transported by a robot or manually to a processing treatment apparatus of the next step.

The procedure of taking out the wafer 300 from the wafer cassette 100 set on the above-mentioned processing treatment stage 202, and the procedure of setting the wafer 300 on the processing treatment stage 202 will next be described by using the sectional views of FIGS. 10 to 14. Specifically, FIG. 10 shows the state of the processing treatment stage 202 before setting the wafer cassette 100. FIG. 11 shows a sectional view taken along the line C-C' in FIG. 7.

First, as shown in FIG. 11, the wafer cassette 100 encasing the wafer 300 is set on the processing treatment stage 202.

Next, as shown in FIG. 12, the wafer lift pin 204 ascends while supporting a center section of the wafer 300. At this time, the wafer lift pin 304 lifts the wafer 300 up to such a height as not to allow the wafer 300 and the wafer cassette 100 to contact with each other even when the wafer cassette 100 is moved horizontally.

As shown in FIG. 13, the wafer cassette 100 then moves horizontally to a position not to block the processing treatment of the wafer 300.

Figure 14:
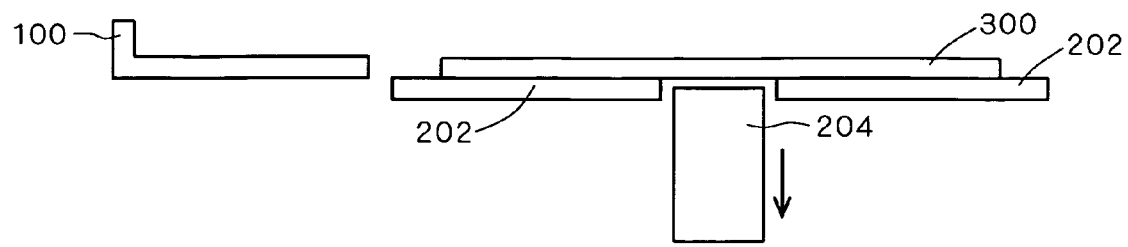
FIG. 14 is other sectional view of the wafer cassette of the first preferred embodiment of the invention.

Subsequently, as shown in FIG. 14, the descent of the wafer lift pin 204 causes the wafer 300 to be set on the processing treatment stage 202.

Thus, the procedure of taking out the wafer 300 from the wafer cassette 100 and setting the wafer 300 on the processing treatment stage 202 by using the wafer lift pin 204 is completed. After the wafer 300 is subjected to processing treatment, it is set on the wafer cassette 100 in the reverse procedure from this procedure.

If in the above-mentioned procedure the thickness of the wafer 300 is extremely small and the wafer 300 curves largely, an auxiliary wafer holding jig may be provided in addition to the wafer lift pin 204 in the processing treatment apparatus. In the following, the procedure of taking out the wafer 300 from the wafer cassette 100 and setting the wafer 300 on the processing treatment stage 202 by using the wafer holding jig 206 will be described by using FIGS. 15 to 20.

Figure 15:
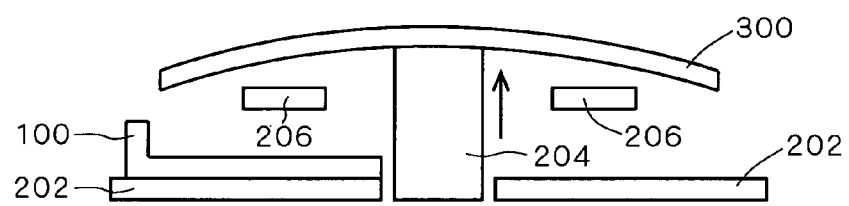
FIG. 15 is other sectional view of the wafer cassette of the first preferred embodiment of the invention.

First, as shown in FIG. 15, when the wafer cassette 100 with the wafer 300 encased therein is set on the processing treatment stage 202, the wafer lift pin 204 lifts the wafer 300 up to such a height as to allow for insertion of the wafer holding jig 206. The wafer holding jig 206 is then inserted beneath the wafer 300, as is the case with an arm of a forklift.

Figure 16:
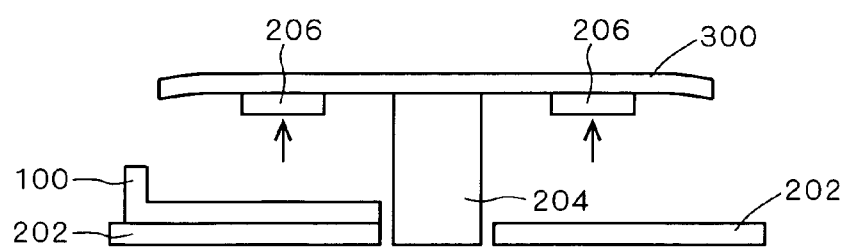
FIG. 16 is other sectional view of the wafer cassette of the first preferred embodiment of the invention.

As shown in FIG. 16, the wafer lift pin 204 and the wafer holding jig 206 then operate integrally to ascend while holding the center section of the wafer 300. At this time, the wafer lift pin 204 and the wafer holding jig 206 lift the wafer 300 up to such a height as not to allow the wafer 300 and the wafer cassette 100 to contact with each other even when the wafer cassette 100 is moved horizontally.

Figure 17:
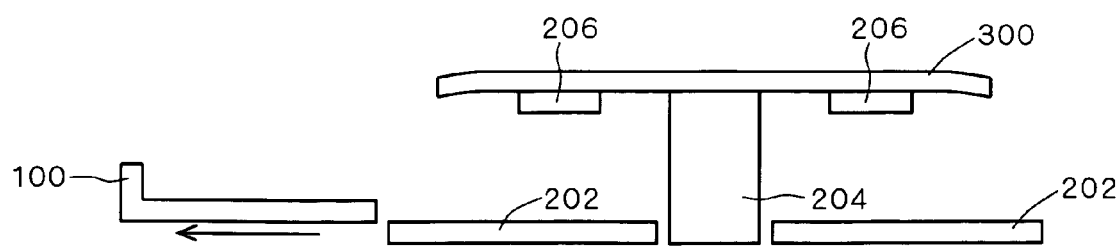
FIG. 17 is other sectional view of the wafer cassette of the first preferred embodiment of the invention.

As shown in FIG. 17, the wafer cassette 100 then moves horizontally to a position not to block the processing treatment of the wafer 300.

Figure 18:
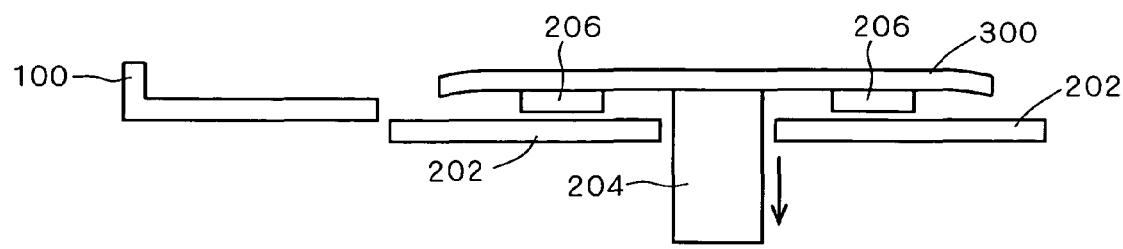
FIG. 18 is other sectional view of the wafer cassette of the first preferred embodiment of the invention.

As shown in FIG. 18, the wafer lift pin 204 and the wafer holding jig 206 then descend to such a predetermined height that the wafer holding jig 206 does not contact with the processing treatment stage 202.

Figure 19:
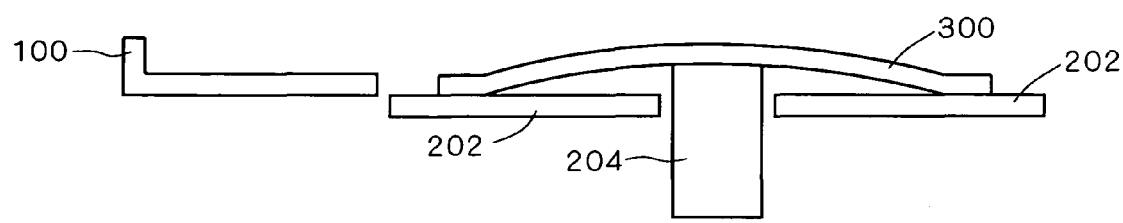
FIG. 19 is other sectional view of the wafer cassette of the first preferred embodiment of the invention.

As shown in FIG. 19, the wafer holding jig 206 is then drawn from beneath the wafer 300.

Figure 20:
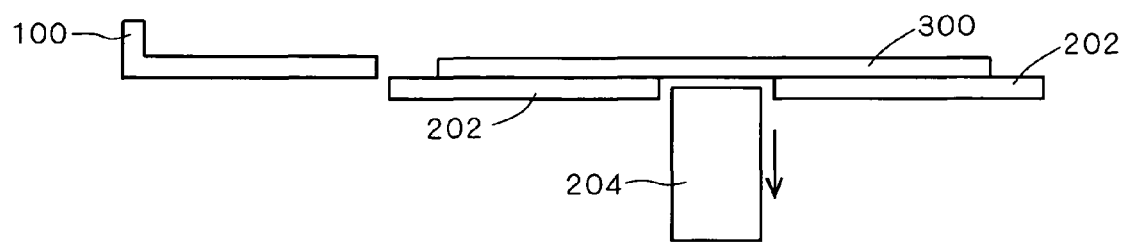
FIG. 20 is other sectional view of the wafer cassette of the first preferred embodiment of the invention.

As shown in FIG. 20, the descent of the wafer lift pin 204 causes the wafer 300 to be set on the processing treatment stage 202.

Thus, the procedure of taking out the wafer 300 from the wafer cassette 100 and setting the wafer 300 on the processing treatment stage 202 by using the wafer lift pin 204 and the wafer holding jig 206 is completed. After the wafer 300 is subjected to processing treatment, it is set on the wafer cassette 100 in the reverse procedure from this procedure.

The operation in a diffusion processing apparatus will next be described. The diffusion processing apparatus is a processing treatment apparatus equipped with a plurality of processing means including a loader, a wafer cassette encasing boat, a diffusion furnace, and an unloader, and transporting means that transports the wafer cassette 100 encasing the wafer 300 therein between the plurality of processing means.

Figure 21:
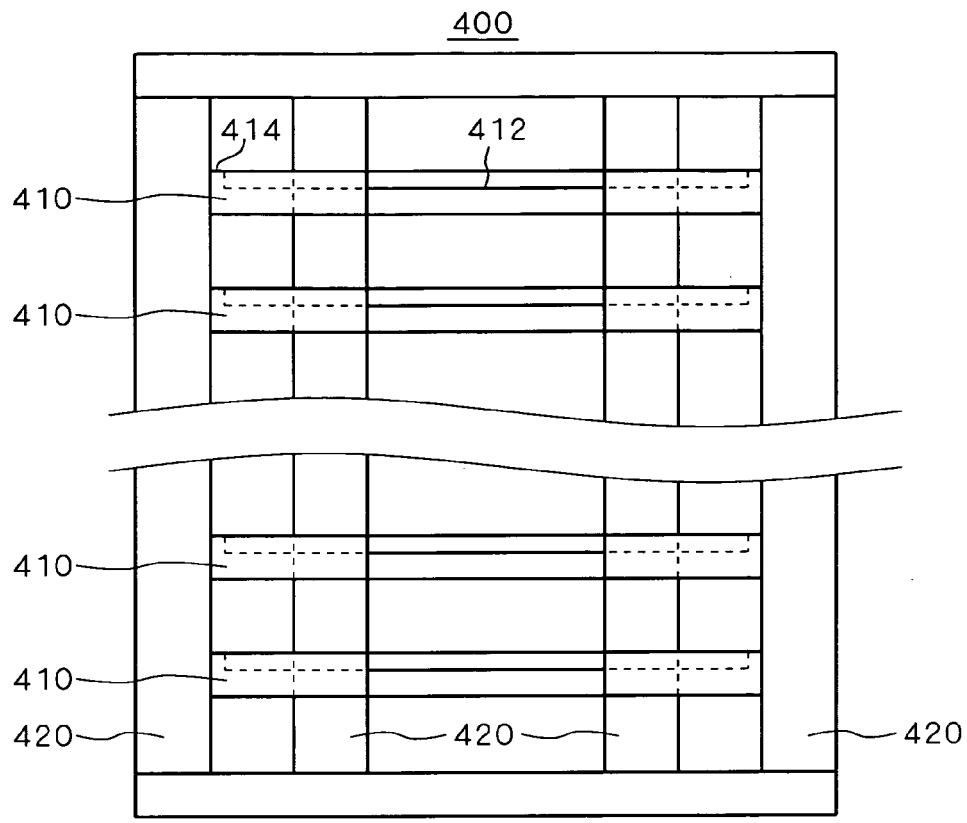
FIG. 21 is a front view of a wafer cassette encasing boat according to the first preferred embodiment of the invention.
Figure 22:
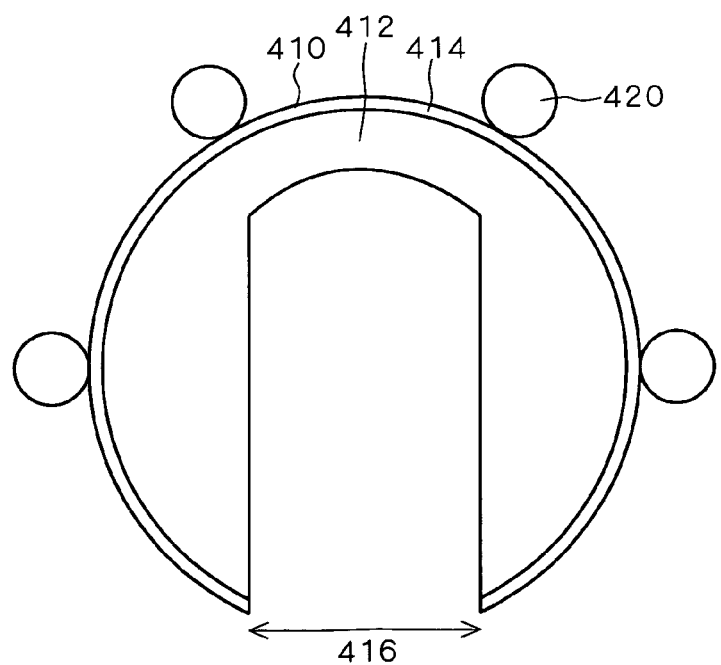
FIG. 22 is a top view of a wafer cassette holding platform according to the first preferred embodiment of the invention.

FIG. 21 is a front view showing a wafer cassette encasing boat 400 for vertical diffusion furnace. As shown in FIG. 21, the wafer cassette encasing boat 400 is equipped with a plurality of wafer cassette holding platforms 410 for accommodating the wafer cassette 100. FIG. 22 is a top view of the wafer cassette holding platform 410.

As shown in FIGS. 21 and 22, the wafer cassette holding platform 410 is supported by a plurality of stays 420. The wafer cassette holding platform 410 is equipped with a wafer cassette holding part 412 for holding the wafer cassette 100, which is brought into contact with the bottom surface of the wafer cassette 100, and a wafer cassette holding part 414 for holding the wafer cassette 100, which is brought into contact with a side surface of the wafer cassette 100. Further, a slotted opening part 416 is disposed from part of the periphery of the wafer cassette holding part 414 to a center section of the wafer cassette holding part 412. As shown in FIGS. 21 and 22, the wafer cassette holding part 412 has a periphery of approximately the same shape as the wafer cassette 100, and the wafer cassette holding part 414 is formed at a higher position than the wafer cassette holding part 412. That is, there is a difference in level between the wafer cassette holding part 412 and the wafer cassette holding part 414. This can prevent the wafer cassette 100 placed on the wafer cassette holding part 412 from slipping down from the wafer cassette holding part 412. It is also capable of easily performing operations such as encasement and takeout of the wafer cassette 100.

As long as the wafer cassette holding part 414 is formed at a higher position than the wafer cassette holding part 412, its peripheral shape may be determined arbitrarily. Further, the shape and dimension of the periphery of the wafer cassette holding part 414, the thickness of the wafer cassette holding platform 410, the dimension of a difference in level, the number of the wafer cassette holding platform 410, the shape of the stay 420, and the number of the stay 420 may be determined arbitrarily depending on the difference in strength, the difference in thermal capacity, or the like due to the material used in the wafer cassette holding platform 410.

Figure 23:
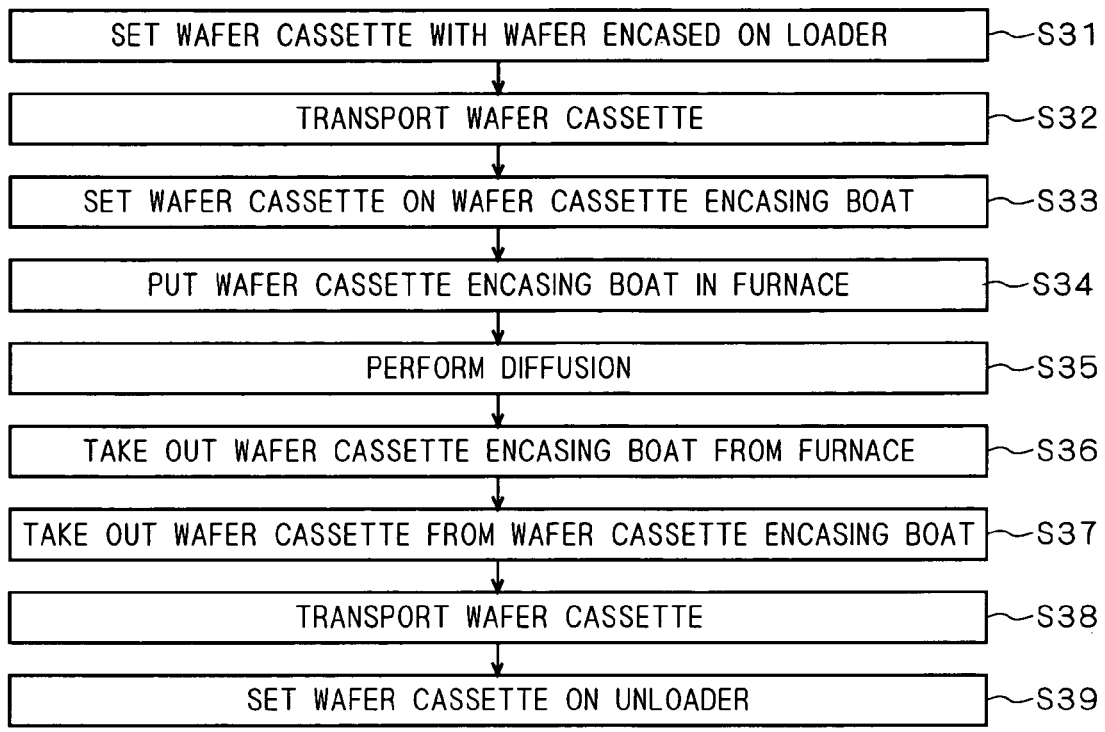
FIG. 23 is a flow chart of a diffusion processing of a wafer according to the first preferred embodiment of the invention.

The operation when the present invention is applied to diffusion processing with use of a general vertical diffusion furnace will next be described by using the flow chart of FIG. 23.

First, the wafer cassette 100 with the wafer 300 encased therein is set on a loader of a diffusion processing apparatus (step S31).

Subsequently, a predetermined number of wafer cassettes 100 with the wafer 300 encased therein are transported (step S32), and set on the wafer cassette encasing boat 400 (step S33). This transportation and setting are done by a robot or the like.

The wafer cassette encasing boat 400 is then put in the diffusion furnace (step S34), and diffusion is performed using a desired technique such as oxidation and annealing (step S35).

After diffusion is completed, the wafer cassette encasing boat 400 is then taken out from the diffusion furnace, followed by cooling (step S36).

After cooling is completed, the wafer cassette 100 is then taken out from the wafer cassette encasing boat 400 by a robot or the like (step S37), and this wafer cassette 100 is then transported (step S38), and set on an unloader of the diffusion processing apparatus (step S39).

Through the foregoing steps S31 to S39, the diffusion processing is completed. The wafer cassette 100 is then transported to a processing treatment apparatus of the next step by a robot or manually.

The transportation of the wafer cassette 100 with use of a wafer cassette transporting robot will next be described by using FIGS. 24 to 26.

Figure 24:
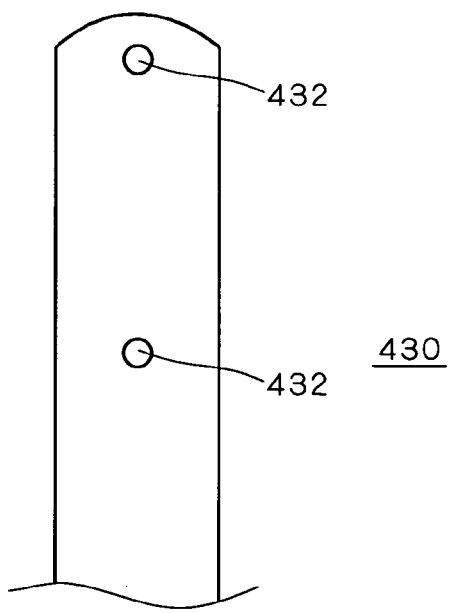
FIG. 24 is a top view of a wafer cassette transporting arm according to the first preferred embodiment of the invention.

FIG. 24 is a top view showing a wafer cassette transporting arm 430 of the wafer cassette transporting robot. The wafer cassette transporting arm 430 is approximately 1 mm in thickness, and has in its length direction a plurality of vacuum adsorption holes 432 for performing vacuum adsorption of the wafer cassette 100.

Figure 25:
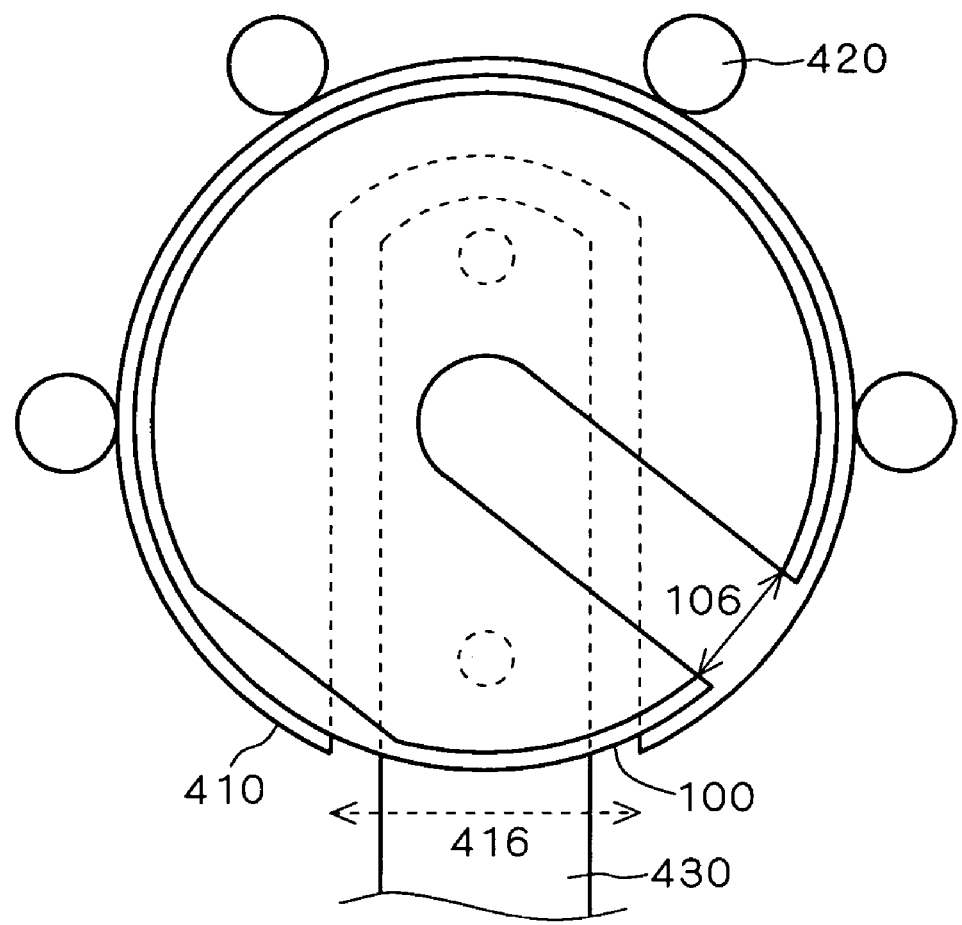
FIG. 25 is other top view of the wafer cassette holding platform according to the first preferred embodiment of the invention.

FIG. 25 is a top view showing the operation of setting the wafer cassette 100 on the wafer cassette holding platform 410 by using the wafer cassette transporting arm 430. At this time, the wafer cassette transporting arm 430 is inserted into the wafer cassette encasing boat 400 through the slotted opening part 416. The wafer cassette 100 is set on the wafer cassette holding platform 410 with the slotted opening part 106 and the slotted opening part 416 staggered with respect to each other at a predetermined angle, in order to eliminate the possibility that the vacuum adsorption holes 432 overlie the slotted opening part 106.

FIG. 26 is a front view showing the state in which the wafer cassette 100 is encased over all of the wafer cassette holding platforms 410 within the wafer cassette encasing boat 400. FIG. 27 is a top view of the wafer cassette holding platform 410 at this time.

In the case of transporting the wafer cassette 100 between buildings, a plurality of the wafer cassettes 100 may be transported with them encased in a wafer cassette case.

FIG. 28 is a front view of a wafer cassette case 500 that can encase five wafer cassettes 100. As shown in FIG. 28, the wafer cassette case 500 has five wafer cassette holding platforms 510, each of which encases one wafer cassette 100. In the wafer cassette case 500, the five wafer cassette holding platforms 510 are aligned vertically. FIG. 29 is a top view of the wafer cassette holding platform 510.

As shown in FIGS. 28 and 29, the wafer cassette holding platform 510 is equipped with a wafer cassette holding part 512 for holding the wafer cassette, which is brought into contact with the bottom surface of the wafer cassette, and a wafer cassette holding part 514 for holding the wafer cassette, which is brought into contact with a side surface of the wafer cassette. Further, a slotted opening part 516 is disposed from part of the periphery of the wafer cassette holding part 514 to a center section of the wafer cassette holding part 512. The wafer cassette transporting arm 430 or the like is inserted through the slotted opening part 516, as in the case with the slotted opening part 416.

As shown in FIGS. 28 and 29, the wafer cassette holding part 512 has a periphery of approximately the same shape as the wafer cassette 100, and the wafer cassette holding part 514 is formed at a higher position than the wafer cassette holding part 512. That is, there is a difference in level between the wafer cassette holding part 512 and the wafer cassette holding part 514. This can prevent the wafer cassette 100 placed on the wafer cassette holding part 512 from slipping down from the wafer cassette holding part 512. It is also capable of easily performing operations such as encasement and takeout of the wafer cassette 100.

The wafer cassette case 500 shown in FIGS. 28 and 29 is equipped with the five wafer cassette holding platforms 510 whose periphery is shaped like a rectangle when viewed from above. Without limiting the number of the wafer cassette holding platform 510 to five, it may be determined arbitrarily, and its peripheral shape when viewed from above may be determined in any shape. Alternatively, a cover for preventing adhesion of dust may be disposed on the front side of the wafer cassette case 500.

Figure 30:
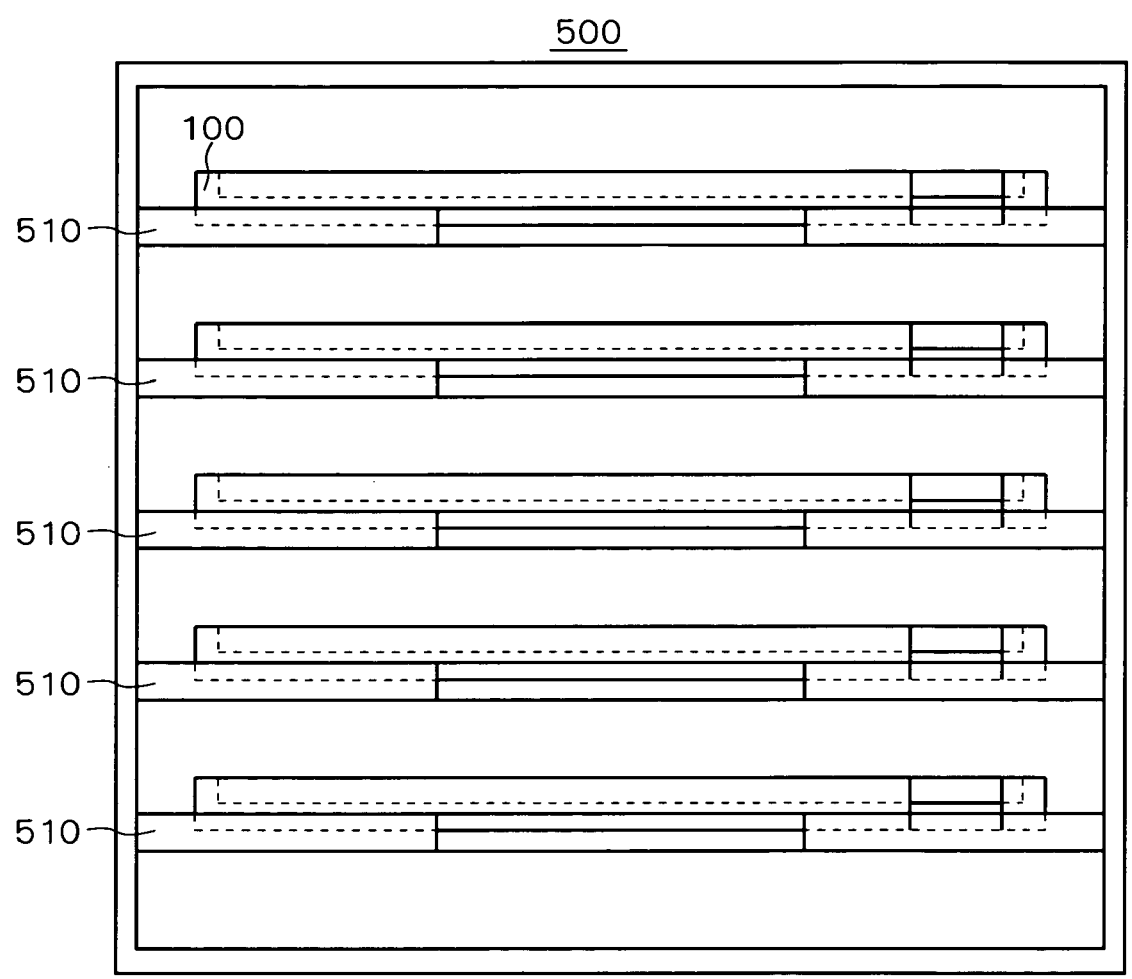
FIG. 30 is other front view of the wafer cassette case according to the first preferred embodiment of the invention.
Figure 31:
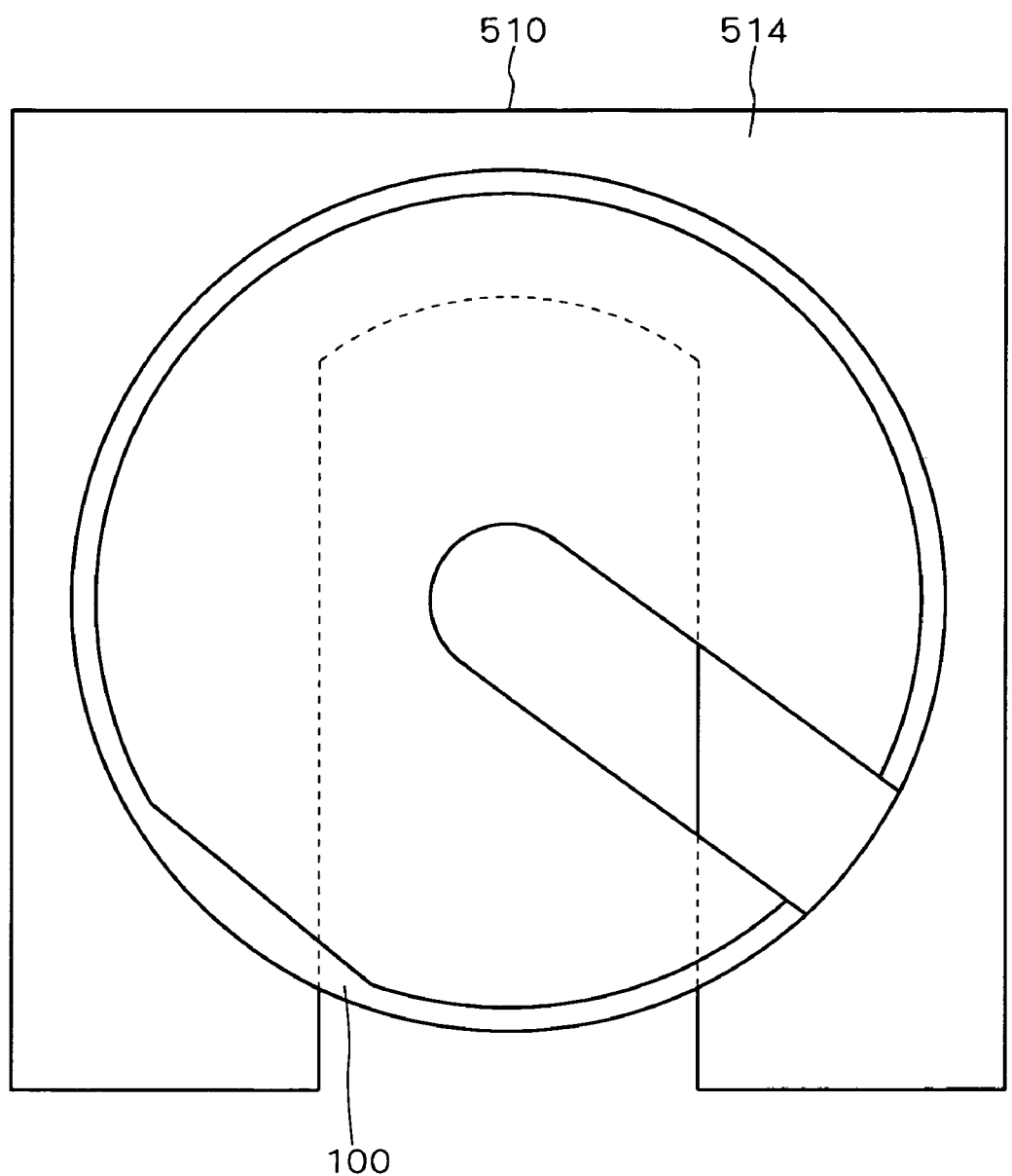
FIG. 31 is other top view of the wafer cassette holding platform according to the first preferred embodiment of the invention.

FIG. 30 is a front view showing the state in which five wafer cassettes 100 are encased in the wafer cassette case 500. FIG. 31 is a top view of the wafer cassette holding platform 510 at this time.

While the forgoing has described the resist coating processing in photoengraving process and the diffusion processing in the heat treatment process, the present invention is similarly applicable to wet etching processing and dry etching processing in chemical treatment process.

In wet etching processing, to etch the surface of a wafer, the wafer is turned over and immersed in an etchant tank. At this time, the falling of the wafer can be prevented by attaching an annular wafer fall preventing jig 600 as shown in the top view of FIG. 32, to the wafer cassette. FIG. 33 is a sectional view taking along the line E-E' in FIG. 32. As shown in FIGS. 32 and 33, the wafer fall preventing jig 600 has a holding part 602 for holding the vicinity of the peripheral of a wafer, and a holding part 604 that is formed outside of the holding part 602 and at a higher position than the holding part 602. That is, there is a difference in level between the holding part 602 and the holding part 604.

Figure 36:
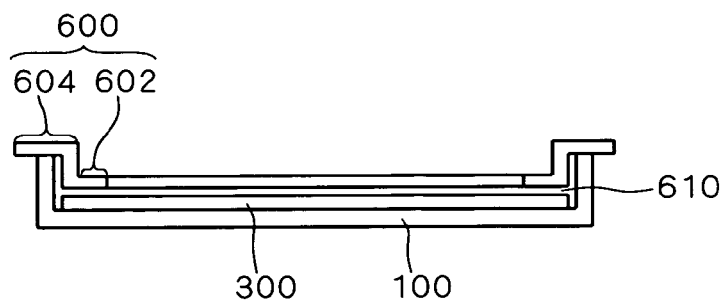
FIG. 36 is other sectional view of the wafer fall preventing jig according to the first preferred embodiment of the invention.

The top view of FIG. 35 shows the state in which the wafer fall preventing jig 600 as shown in FIGS. 32 and 33 overlies the wafer cassette 100 encasing the wafer 300 as shown in the top view of FIG. 34. FIG. 36 is a sectional view taken along the line F-F' in FIG. 35.

As shown in FIG. 36, a gap 610 can be formed between the surface side of the wafer 300 and the holding part 602 when the wafer fall preventing jig 600 overlies the wafer cassette 100, by adjusting the difference in level between the holding part 602 and the holding part 604. This enables etchant to enter a gap formed on the back side of the wafer 300 thereby to uniformly etch the wafer 300, when the wafer cassette 100 is turned over so as to be immersed in an etchant tank.

Although FIG. 36 shows the case where a portion of the holding part 602 which is brought into contact with the surface of the wafer 300 is flat, a plurality of convex portions may be disposed at this portion. Disposing the convex portions reduces the contact area with the surface of the wafer 300, and enables etchant to more easily spread over the peripheral surface of the wafer 300.

Figure 37:
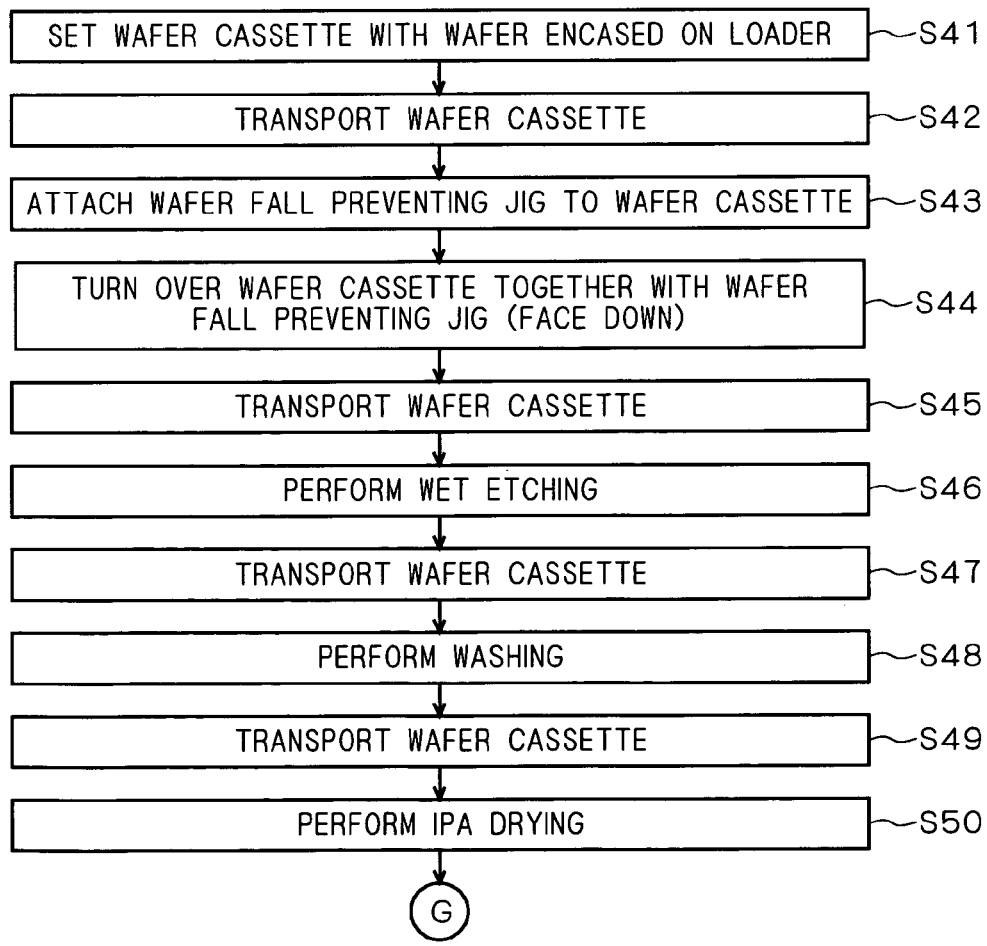
FIG. 37 is a flow chart of a wet etching processing of a wafer according to the first preferred embodiment of the invention.
Figure 38:
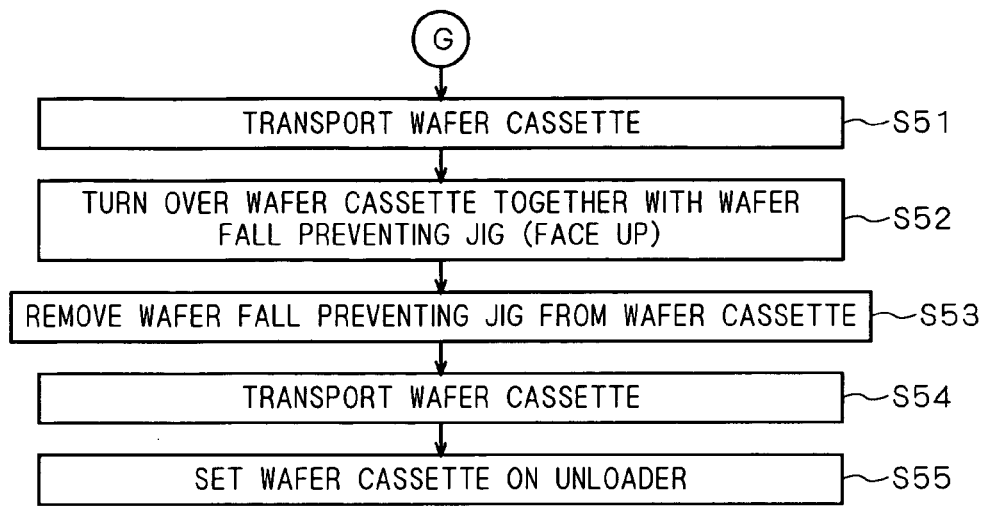
FIG. 38 is other flow chart of the wet etching processing of a wafer according to the first preferred embodiment of the invention.

The operation when the present invention is applied to a general wet etching processing apparatus will next be described by using the flow charts of FIGS. 37 and 38. The wet etching processing apparatus is a processing treatment apparatus equipped with a plurality of processing means including a loader, first wafer cassette operating means, second wafer cassette operating means and an unloader, and transporting means that transports the wafer cassette 100 encasing the wafer 300 therein between the plurality of processing means.

First, the wafer cassette 100 with the wafer 300 encased therein is set on the loader of the wet etching apparatus (step S41).

The wafer cassette 100 encasing the wafer is then transported (step S42), and set on the first wafer cassette operating means. The wafer fall preventing jig 602 is then attached to the wafer cassette 100 in the first wafer cassette operating means (step S43).

The wafer cassette 100 is then turned over together with the wafer fall preventing jig 600 by using an arm or the like in the first wafer cassette operating means (step S44). That is, the surface of the wafer 300 faces down.

Subsequently, the wafer cassette 100 with the wafer fall preventing jig 600 attached thereto is transported (step S45), and immersed in the etchant tank.

The wafer 300 is then subjected to wet etching (step S46).

The wafer cassette 100 with the wafer fall preventing jig 600 attached thereto is then transported (step S47), and immersed in a water tank.

The wafer 300 is then subjected to washing (step S48).

The wafer cassette 100 with the wafer fall preventing jig 600 attached thereto is then transported (step S49), and placed in a processing room for IPA (isopropyl alcohol) dry processing.

The wafer 300 is then subjected to IPA drying (step S50).

The wafer cassette 100 with the wafer fall preventing jig 600 attached thereto is then transported (step S51), and set on the second wafer cassette operating means. In the second wafer cassette operating means, the wafer cassette 100 is turned over together with the wafer fall preventing jig 600 by using an arm or the like (step S52). That is, the surface of the wafer 300 faces up.

Subsequently, in the second wafer cassette operating means, the wafer fall preventing jig 600 is removed from the wafer cassette 100 (step S53).

The wafer cassette 100 is then transported (step S54), and set on the unloader of the coating apparatus (step S55).

Through the foregoing steps S41 to S55, the wet etching processing is completed. The wafer cassette 100 is then transported to a processing treatment apparatus of the next step by a robot or manually.

Figure 39:
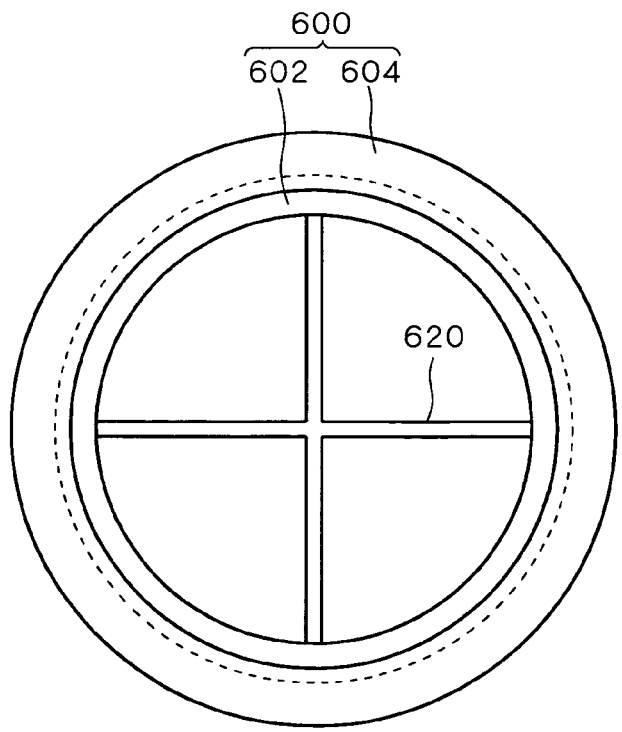
FIG. 39 is other top view of the wafer fall preventing jig according to the first preferred embodiment of the invention.

FIG. 39 shows the wafer fall preventing jig 600 shown in FIG. 32, in which a support frame 620 is disposed on the inside of an annular holding part 602. Disposing the support frame 620 enables the wafer 300 to be held more stably.

On the other hand, it is unnecessary to turn over the wafer 100 in dry etching processing, and it is therefore unnecessary to use the wafer fall preventing jig shown in FIGS. 32 and 39. Accordingly, in dry etching processing, the procedure of taking out the wafer 300 from the wafer cassette 100 and setting the wafer 300 on a processing treatment stage is performed in the same procedure as in the resist coating processing described above by using FIGS. 10 to 14 and FIGS. 15 to 20.

Figure 40:
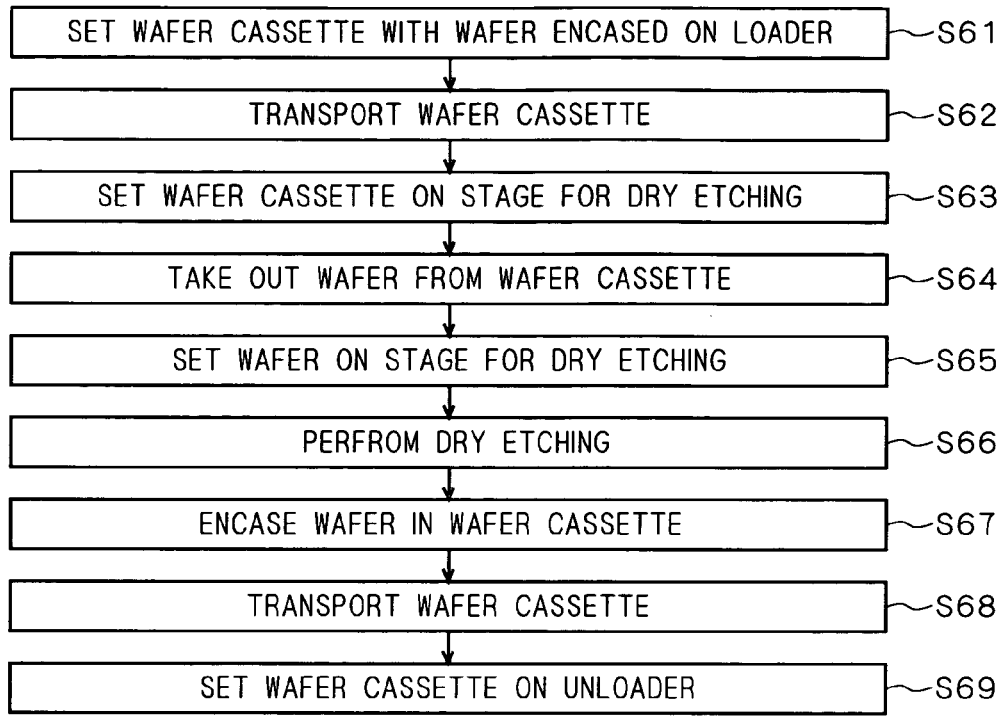
FIG. 40 is a flow chart of a dry etching processing of a wafer according to the first preferred embodiment of the invention.

The operation when the present invention is applied to a general dry etching processing apparatus will next be described by using the flow chart of FIG. 40. This dry etching processing apparatus is a processing treatment apparatus equipped with a plurality of processing means including a loader, a processing treatment stage and an unloader, and transporting means that transports the wafer cassette 100 encasing the wafer 300 therein between the plurality of processing means.

The wafer cassette 100 with the wafer 300 encased therein is first set on the loader of the dry etching apparatus (step S61).

The wafer cassette 100 with the wafer 300 encased therein is then transported (step S62), and set on a processing treatment stage for dry etching processing (referred to as 202c for convenience in describing), which has the same shape as the processing treatment stage 202 (step S63).

The wafer 300 is then taken out from the wafer cassette 100 set on the processing treatment stage 202c (step S64), and set on the processing treatment stage 202c (step S65). The procedure of taking out the wafer 300 from the wafer cassette 100 set on the processing treatment stage 202c and setting the wafer 300 on the processing treatment stage 202c is the same as that described by using FIGS. 10 to 14.

The wafer 300 is then subjected to dry etching (step S66).

The wafer 300 is then encased in the wafer cassette 100 (step S67). The wafer cassette 100 is then transported (step S68), and set on the unloader of the dry etching apparatus (step S69).

Through the foregoing steps S61 to S69, the dry etching processing is completed. The wafer cassette 100 is then transported to a processing treatment apparatus of the next step by a robot or manually.

In the foregoing, the wafer cassette 100 is described as one having the slotted opening part 106 extending from part of the periphery of the wafer holding part 104 to the center section of the wafer holding part 102, as shown in FIG. 1. However, when using the wafer holding jig 206 as shown in FIGS. 15 to 20, the wafer cassette 100 may have an opening part of a different shape.

Figure 41:
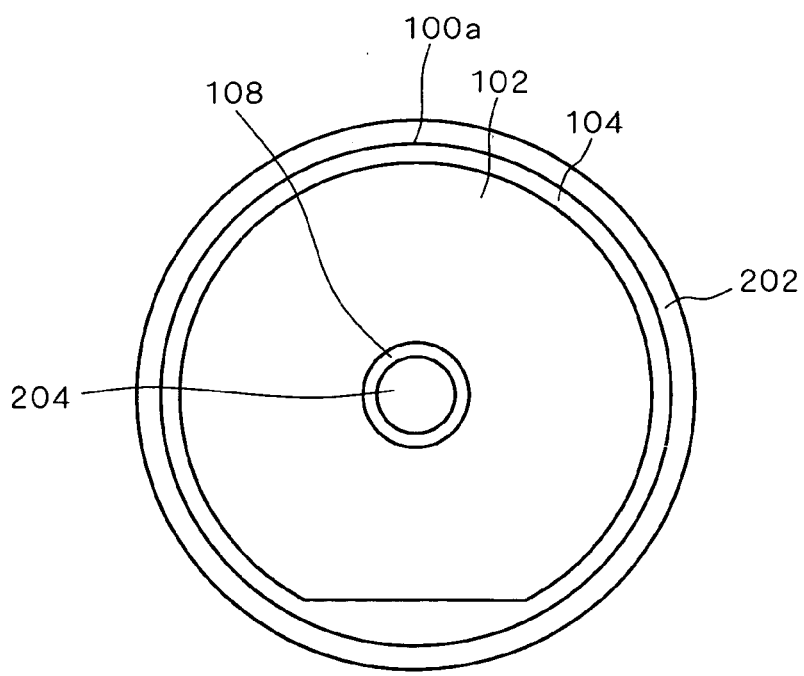
FIG. 41 is other top view of the wafer cassette according to the first preferred embodiment of the invention.
Figure 42:
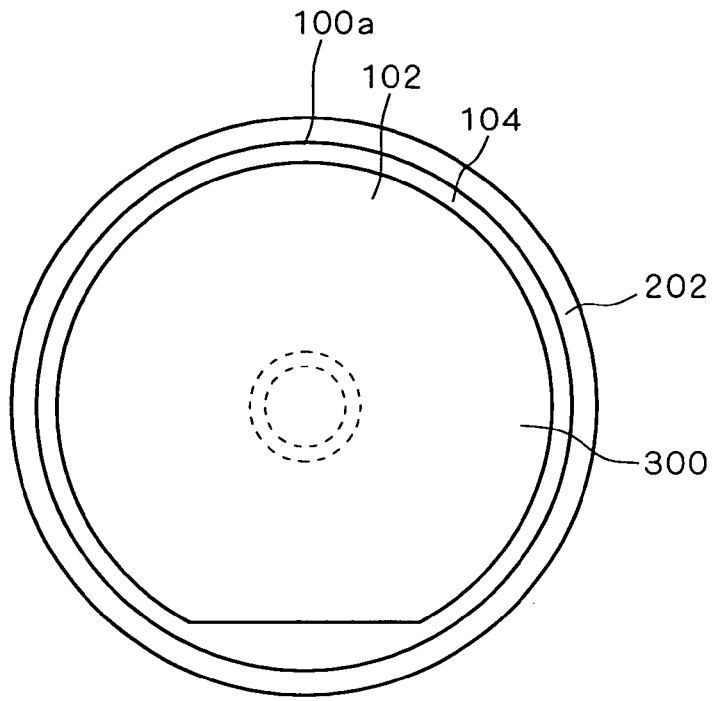
FIG. 42 is other top view of the wafer cassette according to the first preferred embodiment of the invention.

FIG. 41 shows an example of a wafer cassette 100a having a central opening part 108 in the vicinity of the center of the wafer holding part 102, instead of the slotted opening part 106 in the wafer cassette 100. FIG. 42 is a top view showing the state in which the wafer 300 is encased over the wafer cassette 100a shown in FIG. 41.

The procedure of taking out the wafer from the wafer cassette 100a and setting the wafer 300 on the processing treatment stage 202 by using the wafer holding jig 206 will be described below by using FIGS. 43 to 47.

Figure 43:
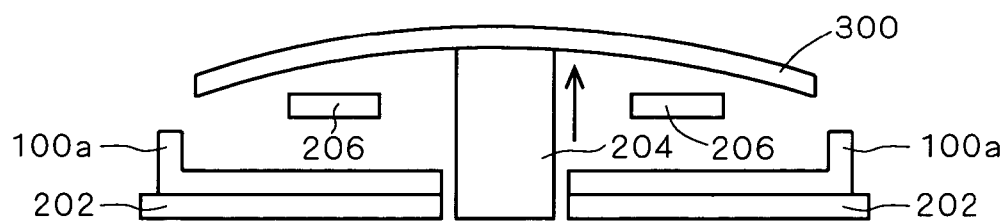
FIG. 43 is other sectional view of the wafer cassette according to the first preferred embodiment of the invention.

First, as shown in FIG. 43, when the wafer cassette 100a with the wafer 300 encased therein is set on the processing treatment stage 202, the wafer lift pin 204 lifts the wafer 300 up to such a height as to allow for insertion of the wafer holding jig 206. The wafer holding jig 206 is then inserted beneath the wafer 300, as is the case with an arm of a forklift.

Figure 44:
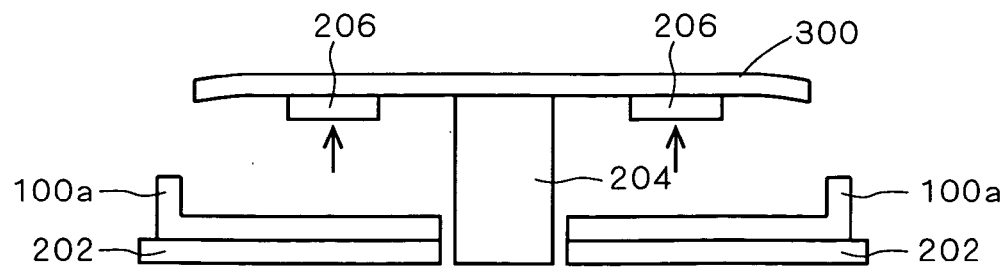
FIG. 44 is other sectional view of the wafer cassette according to the first preferred embodiment of the invention.

As shown in FIG. 44, the wafer lift pin 204 and the wafer holding jig 206 then operate integrally to ascend while holding the center section of the wafer 300. At this time, the wafer lift pin 204 and the wafer holding jig 206 lift the wafer 300 up to such a height as not to allow the wafer 300 and the wafer cassette 100a to contact with each other even when the wafer cassette 100a is moved horizontally.

Figure 45:
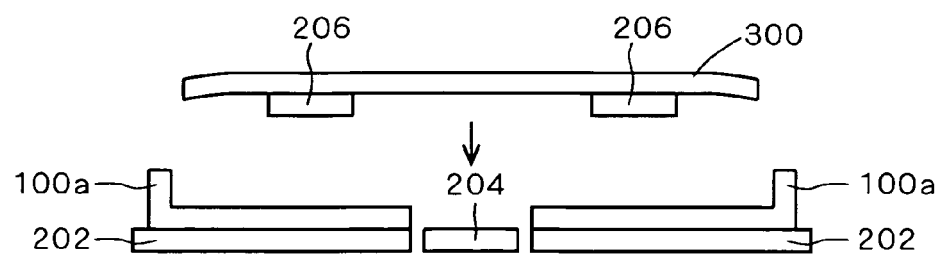
FIG. 45 is other sectional view of the wafer cassette according to the first preferred embodiment of the invention.

As shown in FIG. 45, the wafer lift pin 204 then descends to such a predetermined height that the wafer cassette 100a and the wafer lift pin 204 do not contact with each other even when the wafer cassette 100a is moved horizontally.

Figure 46:
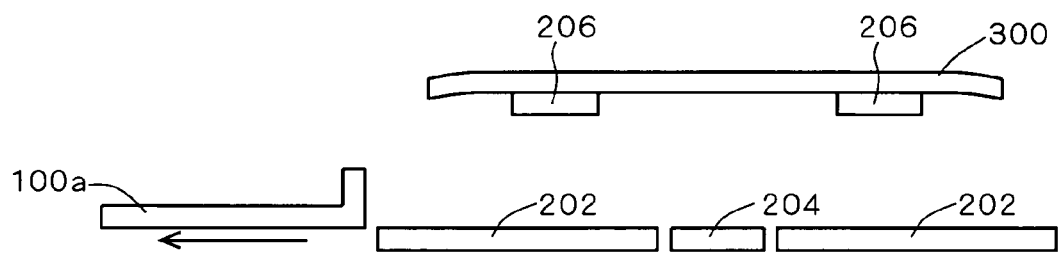
FIG. 46 is other sectional view of the wafer cassette according to the first preferred embodiment of the invention.

As shown in FIG. 46, the wafer cassette 100a then moves horizontally to a position not to block the processing treatment of the wafer 300.

Figure 47:
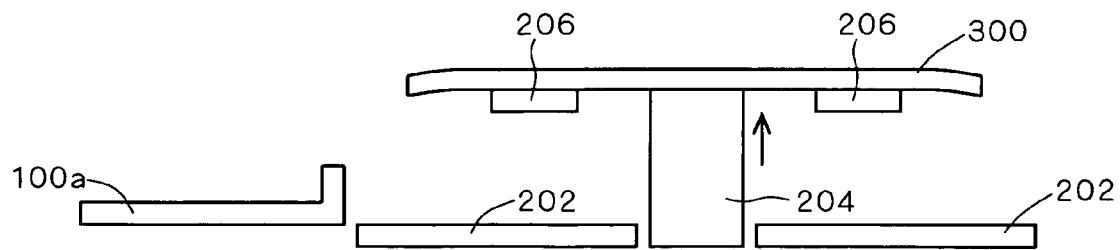
FIG. 47 is other sectional view of the wafer cassette according to the first preferred embodiment of the invention.

As shown in FIG. 47, the wafer lift pin 204 then ascends again and holds the center section of the wafer 300.

Subsequently, in the same steps as in FIGS. 18 to 20, the wafer 300 is set on the processing treatment stage 202.

Thus, the procedure of taking out the wafer 300 from the wafer cassette 100a and setting the wafer 300 on the processing treatment stage 202 by using the wafer lift pin 204 and the wafer holding jig 206 is completed. After the wafer 300 is subjected to processing treatment, it is set on the wafer cassette 100a in the reverse procedure from this procedure.

By so disposing the central opening part 108 instead of the slotted opening part 106, the opening area of the wafer cassette 100a can be reduced thereby to increase the strength.

As described above, in the semiconductor manufacturing apparatus and the semiconductor manufacturing method according to this preferred embodiment, a wafer is not transported solely, but transported with it encased in a wafer cassette. Therefore, even if a thin wafer of low strength contacts with various jigs within the processing treatment apparatus during transportation, it is avoidable that the shock causes damage.

Moreover, when transported by a robot, it is avoidable that a wafer deforms by its own weight and hence contacts with such a portion of the processing treatment apparatus that an originally flat wafer will not contact, thereby damaging the wafer.

Also in the case where a wafer is encased horizontally on the wafer encasing boat in a vertical diffusion furnace, it is avoidable that the wafer deforms in a concavity due to its own weight and heat.

Additionally, since the wafer cassette holds horizontally the entire bottom surface of a wafer, the wafer holding area can be increased than the case where a wafer carrier holds vertically only the peripheral part of a wafer. It is therefore avoidable that wafers deform and hence the wafers contact with each other. Traditionally, when holding a thin wafer vertically by a wafer carrier made of polypropylene or the like that is easy to deform, there have been the problems that the wafer bits into the wafer carrier, thus making it difficult to take out the wafer, and that the wafer is damaged when it is taken out. The use of the wafer cassette according to this preferred embodiment enables to solve these problems.

Additionally, in diffusion processing, when encasing a wafer solely in a wafer encasing boat, it is necessary to prepare a plurality of wafer encasing boats that have grooves of the width according to the thickness of a wafer, respectively, and replace them depending on the wafer, which might be complicated and time-consuming. When using the wafer cassette according to this preferred embodiment, the wafer cassette encasing boat is merely required to have only one type of wafer cassette holding part. It is therefore capable of encasing wafers having different thicknesses in a single wafer cassette encasing boat.

Further, the case of transporting a wafer solely by a robot needs adjustment according to the thickness of the wafer. Therefore, if the worst happens, it might be necessary to prepare a plurality of robots according to the thicknesses of individual wafers. When using the wafer cassette according to this preferred embodiment, only by making adjustment according to the thickness of a wafer cassette, wafers having different thicknesses can be transported by one robot.

Thus, in the semiconductor manufacturing apparatus and the semiconductor manufacturing method according to this preferred embodiment, a wafer can be processed easily and stably irrespective of the thickness.

Further, in diffusion processing and wet etching processing, the processing can be performed with a wafer encased in a cassette, thus permitting more stable wafer processing.

Further, the use of the wafer cassette case encasing a plurality of wafer cassettes enables transportation between buildings or the like to be performed more easily.

Further, although a diffusion furnace containing quartz is used in a general diffusion processing, the use of quartz as the material of the wafer cassette 100 can reduce the contamination of a diffusion furnace in diffusion processing. Furthermore, it becomes possible to reduce corrosion in etching processing.

While the invention has been shown and described in detail, the foregoing description is in all aspects illustrative and not restrictive. It is therefore understood that numerous modifications and variations can be devised without departing from the scope of the invention.

The invention claimed is:

1. A semiconductor manufacturing apparatus comprising:
a cassette that encases a semiconductor substrate;
a plurality of processing means for performing a predetermined processing of the semiconductor substrate;
a transporting means that transports the cassette encasing the semiconductor substrate between the plurality of processing means; and
a semiconductor substrate holding jig that holds the semiconductor substrate by being attached to the cassette in a wet etching processing;
wherein the cassette includes:
 a first holding part having a periphery of approximately a same shape as the semiconductor substrate and supporting a first main surface of the semiconductor substrate; and
 a second holding part located along the periphery of the first holding part at a first higher position than the first holding part and supporting a side surface of the semiconductor substrate;
wherein the semiconductor substrate holding jig includes:
 a third holding part holding a periphery of a second main surface of the semiconductor substrate, and
 a fourth holding part integrally connected with the third holding part by a connecting part forming an L-shape with both the third and fourth holding parts, wherein the fourth holding part is located outside of the third holding part and at a second higher position than the third holding part;
wherein the third holding part is located in the cassette to extend below a top of the second holding part of the cassette toward the second main surface of the semiconductor substrate, and the fourth holding part is located at a third higher position than the second holding part of the cassette, when the semiconductor holding jig is attached to the cassette, wherein a void is maintained between the third holding part and the second main surface of the semiconductor substrate for an entire length along which the third holding part is opposed to the second main surface of the semiconductor substrate, when the third holding part is located in the cassette.

2. The semiconductor manufacturing apparatus according to claim 1, further comprising:
a case that encases a plurality of the cassettes, each of the cassettes encasing a different semiconductor substrate.

3. A semiconductor manufacturing apparatus comprising:
a cassette that encases a semiconductor substrate;
a plurality of processing means for performing a predetermined processing of the semiconductor substrate;
a transporting means that transports the cassette encasing the semiconductor substrate between the plurality of processing means; and
a semiconductor substrate holding jig that holds the semiconductor substrate by being attached to the cassette in a wet etching processing;
wherein the cassette includes:
 a first holding part having a periphery of approximately a same shape as the semiconductor substrate and supporting a first main surface of the semiconductor substrate; and
 a second holding part located along the periphery of the first holding part at a first higher position than the first holding part and supporting a side surface of the semiconductor substrate;
wherein the semiconductor substrate holding jig includes:
 a third holding part holding a periphery of a second main surface of the semiconductor substrate, and
 a fourth holding part integrally connected with the third holding part by a connecting part forming an L-shape with both the third and fourth holding parts, wherein the fourth holding part is located outside of the third holding part and at a second higher position than the third holding part;
wherein the third holding part is located in the cassette to extend below a top of the second holding part of the cassette toward the second main surface of the semiconductor substrate, and the fourth holding part is located at a third higher position than the second holding part of the cassette, when the semiconductor holding jig is attached to the cassette, wherein a gap is maintained between the third holding part of the semiconductor substrate holding jig and the first holding part of the cassette so as to enable an etchant to enter the gap and to flow between the first main surface and the second main surface of the semiconductor substrate along the side surface of the semiconductor substrate, when the third holding part is located in the cassette.

4. The semiconductor manufacturing apparatus according to claim 3, further comprising:
a case that encases a plurality of the cassettes, each of the cassettes encasing a different semiconductor substrate.

* * * * *